United States Patent
Tam et al.

(10) Patent No.: US 10,925,160 B1
(45) Date of Patent: Feb. 16, 2021

(54) ELECTRONIC DEVICE WITH A DISPLAY ASSEMBLY AND SILICON CIRCUIT BOARD SUBSTRATE

(71) Applicant: Amazon Technologies, Inc., Seattle, WA (US)

(72) Inventors: Samuel Waising Tam, Daly City, CA (US); Jasmin B. Farshi, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 611 days.

(21) Appl. No.: 15/195,561

(22) Filed: Jun. 28, 2016

(51) Int. Cl.
  *H05K 5/00* (2006.01)
  *H05K 1/11* (2006.01)
  *H05K 1/03* (2006.01)
  *H05K 5/03* (2006.01)
  *H05K 9/00* (2006.01)
  (Continued)

(52) U.S. Cl.
  CPC ........... *H05K 1/111* (2013.01); *H05K 1/0306* (2013.01); *H05K 1/117* (2013.01); *H05K 1/144* (2013.01); *H05K 5/00* (2013.01); *H05K 5/003* (2013.01); *H05K 5/0017* (2013.01); *H05K 5/03* (2013.01); *H05K 9/0054* (2013.01); *G06F 3/0412* (2013.01); *G06F 2203/04105* (2013.01); *H05K 2201/041* (2013.01); *H05K 2201/10098* (2013.01); *H05K 2201/10121* (2013.01); *H05K 2201/10128* (2013.01); *H05K 2201/10159* (2013.01); *H05K 2201/10318* (2013.01); *H05K 2201/10371* (2013.01); *H05K 2201/10378* (2013.01); *H05K 2201/10545* (2013.01)

(58) Field of Classification Search
  CPC ...... H05K 1/111; H05K 1/0306; H05K 1/117; H05K 1/144; H05K 5/0017; H05K 5/003; H05K 5/03; H05K 9/0054
  See application file for complete search history.

(56) References Cited

U.S. PATENT DOCUMENTS

| | | | | |
|---|---|---|---|---|
| 5,159,700 A | * | 10/1992 | Reid | G02B 6/43 257/E31.095 |
| 5,399,898 A | * | 3/1995 | Rostoker | G03F 7/70433 257/499 |

(Continued)

FOREIGN PATENT DOCUMENTS

| | | |
|---|---|---|
| WO | 2012038703 | 3/2012 |
| WO | WO2012038703 A2 | 3/2012 |

OTHER PUBLICATIONS

Chowdhury, et al., "Challenges of Megapixel Camera Module Assembly and Test" Proceedings of 2005 Electronic Components and Technology Conference, pp. 1390-1401.

(Continued)

*Primary Examiner* — Hoa C Nguyen
*Assistant Examiner* — Keith DePew
(74) *Attorney, Agent, or Firm* — K&L Gates LLP

(57) ABSTRACT

A silicon circuit board substrate is utilized in an electronic device in place of conventional PCB motherboard. The silicon circuit board substrate is adhered to the back side of a display assembly to provide structural support for the substrate. The silicon circuit board substrate and the display assembly may be electrically connected via contact pads provided on the respective sides of the substrate and the display assembly that are connected together.

23 Claims, 14 Drawing Sheets

(51) Int. Cl.
*H05K 1/14* (2006.01)
*G06F 3/041* (2006.01)

(56) References Cited

U.S. PATENT DOCUMENTS

| | | | |
|---|---|---|---|
| 6,703,702 B2* | 3/2004 | Inoue | H01L 23/057 257/584 |
| 7,230,777 B2 | 6/2007 | Ye | |
| 7,525,096 B2 | 4/2009 | Nakajo et al. | |
| 7,555,211 B2* | 6/2009 | Go | G03B 7/09908 348/340 |
| 7,570,297 B2 | 8/2009 | Maeda et al. | |
| 7,633,543 B2 | 12/2009 | Shinomiya | |
| 7,884,875 B2* | 2/2011 | Kwon | H01L 27/14618 348/340 |
| 7,948,555 B2 | 5/2011 | Kwon et al. | |
| 8,009,971 B2 | 8/2011 | Koo et al. | |
| 8,089,694 B2 | 1/2012 | Wernersson | |
| 8,092,102 B2 | 1/2012 | Shangguan et al. | |
| 8,149,321 B2 | 4/2012 | Ryu et al. | |
| 8,170,408 B2 | 5/2012 | Nasiri et al. | |
| 8,174,583 B2 | 5/2012 | Ko et al. | |
| 8,223,249 B2 | 7/2012 | Chang | |
| 8,248,514 B1 | 8/2012 | Chang | |
| 8,248,523 B2 | 8/2012 | Chua et al. | |
| 8,405,756 B2 | 3/2013 | Yano et al. | |
| 8,430,579 B2 | 4/2013 | Tam et al. | |
| 9,088,705 B1* | 7/2015 | Tam | H04N 5/2253 |
| 9,241,097 B1 | 1/2016 | Tam | |
| 2001/0055073 A1 | 12/2001 | Shinomiya | |
| 2002/0167081 A1 | 11/2002 | Kondo | |
| 2002/0180061 A1 | 12/2002 | Caletka et al. | |
| 2003/0016300 A1 | 1/2003 | Ting | |
| 2003/0232462 A1* | 12/2003 | Poo | H01L 23/13 438/117 |
| 2004/0115866 A1 | 6/2004 | Bang et al. | |
| 2004/0212719 A1 | 10/2004 | Ikeda | |
| 2004/0223072 A1 | 11/2004 | Maeda et al. | |
| 2005/0024752 A1 | 2/2005 | Webster | |
| 2005/0048692 A1 | 3/2005 | Hanada et al. | |
| 2005/0134721 A1* | 6/2005 | Ito | H04N 5/2253 348/363 |
| 2005/0236708 A1 | 10/2005 | Farnworth et al. | |
| 2005/0285973 A1* | 12/2005 | Singh | H01L 27/14618 348/374 |
| 2006/0065903 A1* | 3/2006 | Sakurai | H01L 27/3276 257/82 |
| 2007/0019354 A1* | 1/2007 | Kamath | H01C 1/146 361/118 |
| 2008/0170141 A1* | 7/2008 | Tam | H04N 5/2251 348/294 |
| 2008/0252771 A1 | 10/2008 | Wu | |
| 2008/0304821 A1 | 12/2008 | Jeung et al. | |
| 2009/0016039 A1 | 1/2009 | Imamura | |
| 2009/0190025 A1 | 7/2009 | Lu | |
| 2009/0213314 A1* | 8/2009 | Azuma | G02F 1/133305 349/122 |
| 2010/0039603 A1* | 2/2010 | Chen | G02F 1/136277 349/150 |
| 2010/0053423 A1 | 3/2010 | Singh | |
| 2010/0315570 A1* | 12/2010 | Mathew | G06F 1/1637 349/58 |
| 2011/0075999 A1 | 3/2011 | Chiu | |
| 2011/0102667 A1 | 5/2011 | Chua et al. | |
| 2011/0122267 A1 | 5/2011 | Ahn et al. | |
| 2011/0150462 A1 | 6/2011 | Chiu et al. | |
| 2011/0156187 A1 | 6/2011 | Tu et al. | |
| 2011/0194014 A1* | 8/2011 | Ozaki | G02B 13/0035 348/340 |
| 2011/0194023 A1 | 8/2011 | Tam et al. | |
| 2011/0262121 A1 | 10/2011 | Yanagisawa et al. | |
| 2011/0267535 A1 | 11/2011 | Seo et al. | |
| 2012/0049079 A1 | 3/2012 | Yanoff et al. | |
| 2012/0139821 A1* | 6/2012 | Kim | H01L 51/5253 345/76 |
| 2012/0217607 A1 | 8/2012 | Hanai et al. | |
| 2012/0242883 A1 | 9/2012 | Pavithran et al. | |
| 2012/0276951 A1 | 11/2012 | Webster et al. | |
| 2012/0312976 A1* | 12/2012 | Boulanger | H04N 5/33 250/252.1 |
| 2013/0038783 A1 | 2/2013 | Shimizu et al. | |
| 2013/0050571 A1* | 2/2013 | Tam | H01L 27/14618 348/374 |
| 2013/0107068 A1* | 5/2013 | Kim | G03B 5/00 348/208.11 |
| 2013/0128106 A1* | 5/2013 | Tam | H04N 5/2253 348/374 |
| 2013/0242243 A1* | 9/2013 | Supon | G02F 1/13452 349/122 |
| 2013/0242244 A1* | 9/2013 | Supon | G02F 1/1339 349/122 |
| 2014/0055630 A1* | 2/2014 | Gregory | G03B 3/02 348/208.2 |
| 2014/0078701 A1* | 3/2014 | Tanabe | H01L 51/5246 361/760 |
| 2014/0145150 A1* | 5/2014 | de Jong | H01L 27/3227 257/40 |
| 2014/0192495 A1* | 7/2014 | Yajima | G06F 1/1637 361/752 |
| 2014/0252944 A1* | 9/2014 | Lee | H01L 51/5096 313/504 |
| 2014/0299844 A1* | 10/2014 | You | H01L 51/5246 257/40 |
| 2015/0054155 A1* | 2/2015 | Ohara | H01L 23/562 257/738 |
| 2015/0062854 A1 | 3/2015 | Choi et al. | |
| 2015/0303244 A1* | 10/2015 | de Jong | H01L 27/3227 257/40 |
| 2016/0299387 A1* | 10/2016 | Yamazaki | H01L 27/3232 |
| 2017/0373042 A1* | 12/2017 | Shizukuishi | G01T 7/00 |
| 2018/0088705 A1* | 3/2018 | Takahashi | G06F 3/044 |

OTHER PUBLICATIONS

Chowdhury et al; Challenges of Megapixel Camera Module Assembly and Test; Proceedings of the 2005 Electronic Components and Technology Conference; pp. 1390-1401.
U.S. Appl. No. 14/040,385, filed Sep. 27, 2013.
U.S. Appl. No. 14/040,396, filed Sep. 27, 2013.
U.S. Appl. No. 14/040,403, filed Sep. 27, 2013.
U.S. Appl. No. 14/040,408, filed Sep. 27, 2013.
Non-Final Office Action dated Jan. 30, 2015 in U.S. Appl. No. 14/109,502, filed Dec. 17, 2013.
Non-Final Office Action dated Mar. 17, 2015 in U.S. Appl. No. 14/109,491, filed Dec. 17, 2013.

* cited by examiner

ELECTRONIC DEVICE WITH A DISPLAY ASSEMBLY AND SILICON CIRCUIT BOARD SUBSTRATE

BACKGROUND

Portable electronic devices, such as mobile phones, tablet computers, and electronic book (e-book) readers, have become increasingly popular. As the popularity of these electronic devices continues to increase, device manufacturers seek ways to decrease the thicknesses of the devices, while continuing to add more powerful processors, cameras, and other improved functionality. These types of portable electronic devices are often subjected to much higher levels of physical stress and detrimental environmental conditions than are generally experienced by traditional desktop computing devices, so it is desirable to design the devices with improved durability to endure these conditions without failing. In addition, there is an ongoing desire to improve quality and functionality while decreasing the cost of components and manufacturing.

Accordingly, there is a need for improved designs and manufacturing processes for electronic devices.

DETAILED DESCRIPTION

In the following description, reference is made to the accompanying drawings which illustrate several embodiments of the present disclosure. It is to be understood that other embodiments may be utilized and mechanical, compositional, structural, electrical, and operational changes may be made without departing from the spirit and scope of the present disclosure. The following detailed description is not to be taken in a limiting sense, and the scope of the embodiments of the disclosure is defined only by the claims of the issued patent. It is to be understood that the drawings are not necessarily drawn to scale.

Systems and methods in accordance with various embodiments of the present disclosure provide electronic device designs that can provide smaller exterior form factors, without compromising the durability or functionality of the device. These designs may mount one or more components onto thin silicon substrates instead of the printed circuit boards (PCB) typically used in electronic devices. Because thin silicon substrates are fragile and are easily broken, the substrate can be adhered directly to the back side of the display assembly such that the rigid glass back side of the display assembly provides structural support for the substrate, thereby decreasing the likelihood of damage. In addition, the electrical connections between the silicon substrate and the display assembly may be made by directly bonding contact pads on the silicon substrate with corresponding contact pads on the back side of the display assembly. This can eliminate the need to use a flex cable, wire bonding, or other traditional interconnection components. As a result, these embodiments can provide a compact form factor while being relatively robust to thermal cycling, vibrations, or other modes of failure.

In some embodiments, the silicon substrate may be reinforced with a molded reinforcing member, which, in turn, is adhered to the back side of the display assembly instead of directly bonding the silicon substrate to the display assembly.

In some embodiments, the silicon substrate may be provided with edge contacts having a castellated shape. The castellated edge contacts may be used to electrically and mechanically couple the substrate to pin contacts provided on the display assembly or an interposer circuit board. In some embodiments, the electronic device may utilize a modularized design incorporating multiple modules, with each module comprising a silicon substrate with electronic components mounted thereon and castellated contacts along the edge of the substrate. As a result, if a design change is made to one component, that component's module can be easily replaced with the new design without impacting the other modules, which can continue to be used unchanged.

Figure 1:
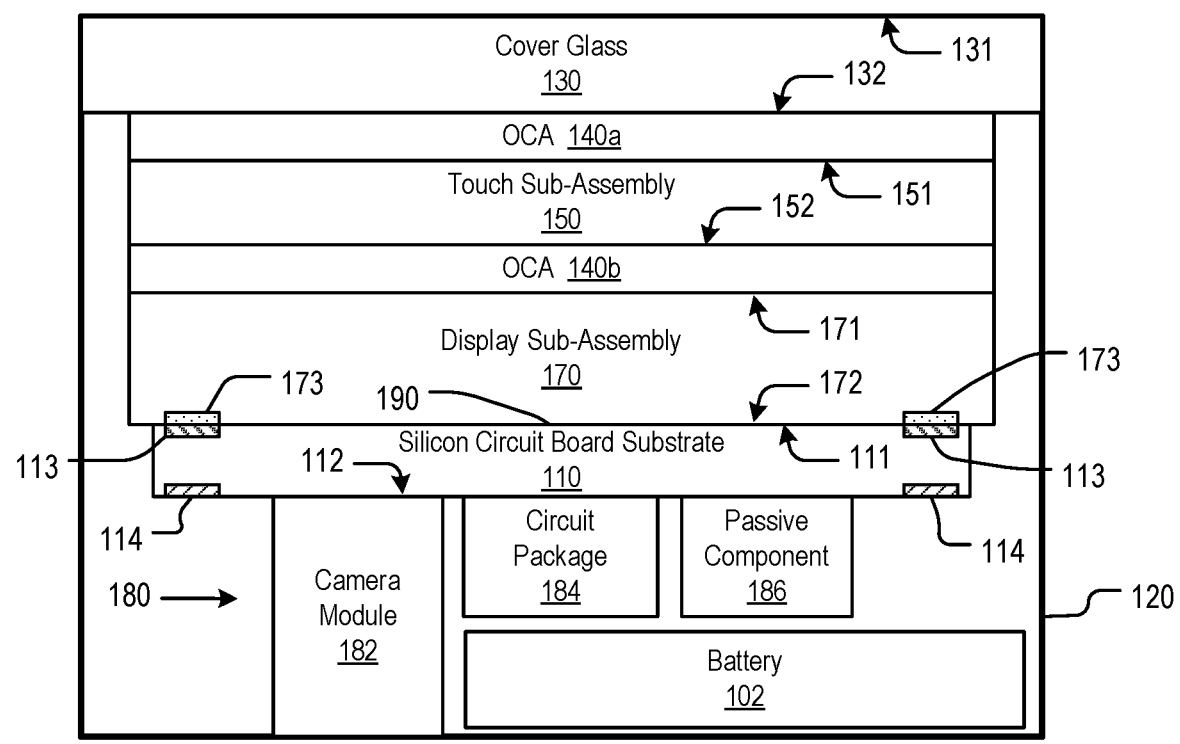
FIG. 1 is a block diagram illustrating an electronic device with a silicon circuit board substrate, in accordance with embodiments of the disclosure.

FIG. 1 is a block diagram illustrating an electronic device 100 with a silicon circuit board substrate 110, in accordance with embodiments of the disclosure. FIG. 1 is a simplified block diagram for illustrative purposes, and in other embodiments, the components shown in FIG. 1 may be omitted or replaced with different types of components, and additional components may be used. As shown in FIG. 1, the device 100 includes a housing 120, which when coupled to a cover glass 130 contains the various components of the device 100, including a rechargeable battery module 102 for powering the various components during use.

A touch subassembly 150 is coupled to the interior side 132 of the cover glass 130 with a first adhesive layer 140a, which can be, e.g., an optically clear adhesive (OCA) layer. A user may provide user inputs to the device 100 for causing an action to occur on the device 100 by interacting with the touch subassembly 150. For example, an action may be turning the page of an electronic book, selecting an icon or menu item, or moving or zooming an image displayed on the device 100. Interacting with the touch subassembly 150 may comprise applying a touch or multiple touches to a portion of the cover glass 130. In some embodiments, the touch subassembly 150 may be capable of detecting touches as well as determining an amount of pressure or force of those touches. A touch subassembly 150 may comprise a capacitive touch sensitive sensor, an infrared touch screen sensor, a force sensitive resistance sensor, or other touch sensing technology. The touch subassembly 150 may have a first side 151 and an opposing second side 152.

A display subassembly 170 has a first side 171 coupled to the second side 152 of the touch subassembly 150 with a second adhesive layer 140b, e.g., a second OCA layer. The display subassembly 170 may represent any of an array of display technologies for displaying content on the device 100, including, e.g., a liquid crystal display (LCD), such as a backlit LCD, reflective LCD, or transflective LCD, an organic light emitting diode (OLED) display, an electrophoretic display (EPD), an electrowetting display (EWD), an electrochromic display (ECD), or other suitable component(s) for displaying content. The display subassembly 170 may be coupled to a corresponding display controller via the silicon circuit board substrate 110, as will be described in greater detail below.

In conventional computing devices, the touch subassembly and display subassembly may be coupled to a printed circuit board (PCB) main board. The PCB may be formed by a laminate of FR-2 or FR-4 glass epoxy substrates having conductive interconnects formed thereon, and may include contact pads for making electrical connections with the touch subassembly and display subassembly. Additional components, such as a processor, passive components, or other electronic components may be mounted directly to the surface of the PCB main board, and the PCB main board may be configured to send and receive electrical signals to and from the various components mounted or coupled to the PCB main board, and/or to one or more other PCBs having components mounted thereon. Although PCBs are very commonly used in computing devices, they are relatively large and thick, which limits the extent to which the device can be made smaller and thinner, and they have numerous component interconnects, which are susceptible to failure when the device is subjected to physical stress.

In accordance with embodiments of the disclosure, a silicon circuit board substrate 110, also referred to as substrate 110, is mechanically and electrically coupled to the display subassembly 170 and may provide some or all of the functionality typically provided with a conventional PCB main board.

The substrate 110 may, in example embodiments, be fabricated from silicon (Si), such as silicon wafers of any suitable size (e.g., 4-inch diameter, 6-inch diameter, etc.). In other example embodiments, the substrate 110 may be fabricated from non-silicon rigid materials, such as glass, quartz, III-V semiconductor substrates (e.g., GaAs, InP, etc.), or sapphire.

In example embodiments, the substrate 110 may include interconnects (e.g., metallic traces) for routing electrical signals, such as electrical signals from the display subassembly 170 and other components, as will be described in further detail below. The substrate 110 may comprise one or more levels of metallic interconnects and/or vias, which may be fabricated using any suitable processes and any suitable materials. The interconnect metal traces may be fabricated by either subtractive metallization processes (e.g., aluminum physical vapor deposition (PVD)/plasma etch) or by inlaid processes (e.g., copper damascene integration). In some cases, both subtractive and inlaid processes may be used, such as on different layers of interconnects. In some example embodiments, bond pads may be formed on one or preferably both sides of the substrate 110, such as in the top layer of metallic interconnect on either side of the substrate 110. These bond pads may enable the electrical attachment of a variety of elements onto the substrate 110, as described below. The bond pads may be used for forming joints, or otherwise electrically joining bonding elements of electrical components. Any suitable mechanism may be used for joining components onto the substrate 110, such as flip-chip, thermosonic bonding, thermocompression bonding, solder bonding, wire bond, anisotropic conductive paste (ACP), anisotropic conductive film (ACF), nonconductive paste (NCP), wedge bonding, combinations thereof, or the like.

The substrate 110, in some example embodiments, may further include one or more thru-silicon vias (TSV) to provide electrical interconnections between the sides 111-112 of the substrate 110. The TSV may be fabricated in the substrate 110 by any variety of suitable processes. These processes may include processes for making the TSV holes, electrically and/or chemically insulating the TSV holes, and/or filling and/or making contact to the TSV holes. In some example embodiments, the TSVs may underlie other interconnect metal layers of the substrate 110, such as bond pads or contact pads. In other example embodiments, the ends of the TSVs may form electrical surfaces onto which other electrical components may be attached, such as by flip-chip, wirebond, or ACP. Although TSVs can be used to form interconnections extending from one side of the substrate 110 to the other, in some embodiments, one or more of the contact pads formed on one side of the substrate 110 are not electrically connected to contact pads on the other side of the substrate 110, and instead are connected to other contact pads on the same side of the substrate 110.

In the display subassembly 170 shown in FIG. 1, the first side 171 is the image display side, which is positioned adjacent to the cover glass 130 and displays the content for viewing, and the second side 172 is the interface side, which includes an electrical interface 173.

The first side 111 of the substrate 110 is a coupling side, which is coupled to the second side 172 of the display subassembly 170 and includes an electrical interface 113 for making an electrical connection with the corresponding electrical interface 173 of the display subassembly 170. The electrical interfaces 113, 173 may comprise, e.g., an array of contact pads, bond pads, or other interconnect structure for making electrical contact with corresponding contact pads on the other interface. The second side 112 of the silicon circuit board substrate 110 is a component side onto which one or more electronic components 180 are mounted, such as camera module 182, one or more circuit components 184, and/or one or more passive components 186. The substrate 110 can then send and receive electrical signals to and from the various electronic components 180, the display subassembly 170, and any other components operatively coupled to the substrate 110.

Figure 2A:
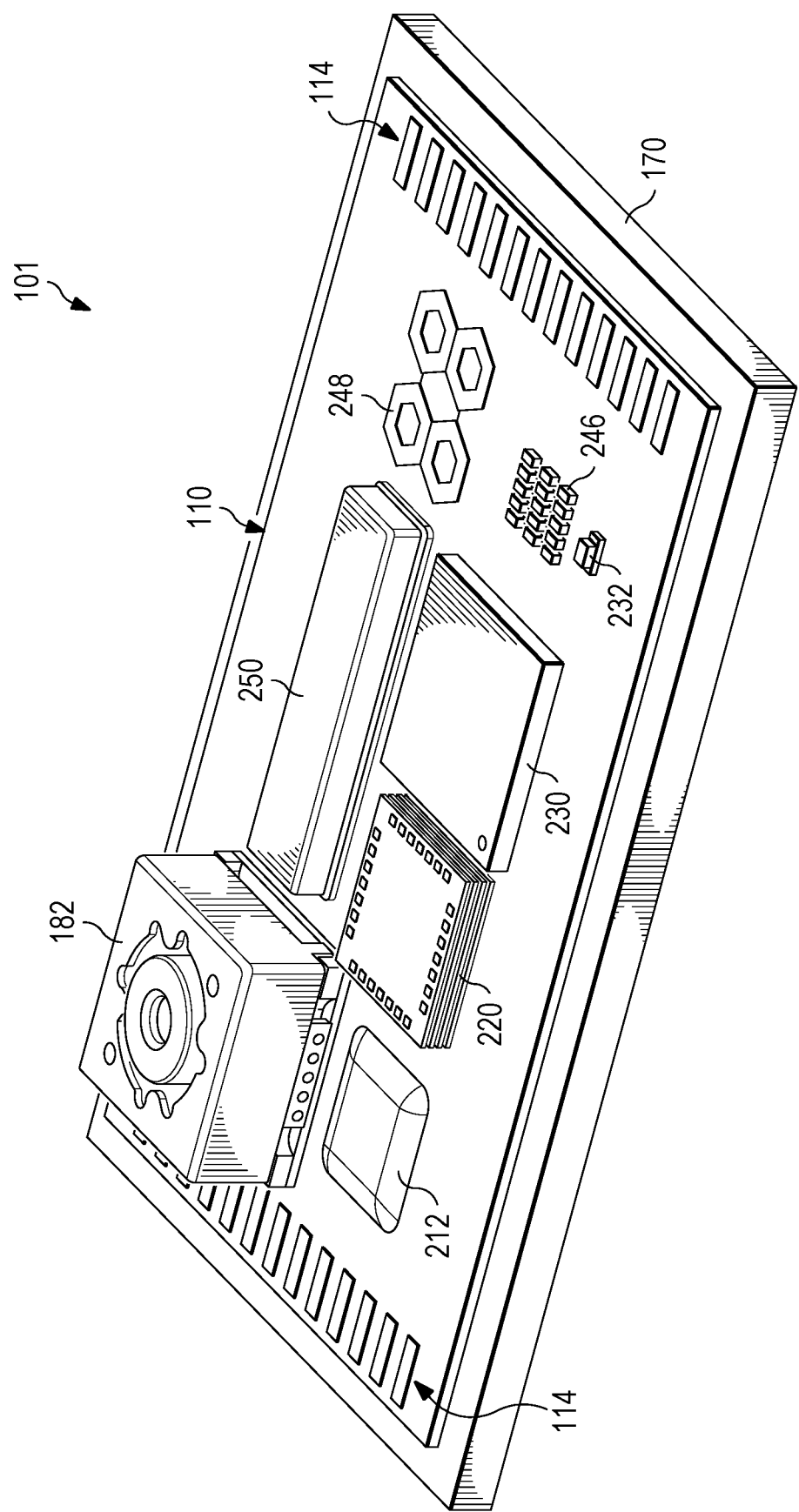
FIGS. 2A-2C illustrate different views of a silicon circuit board substrate coupled to a display subassembly, in accordance with embodiments of the disclosure.
Figure 2B:
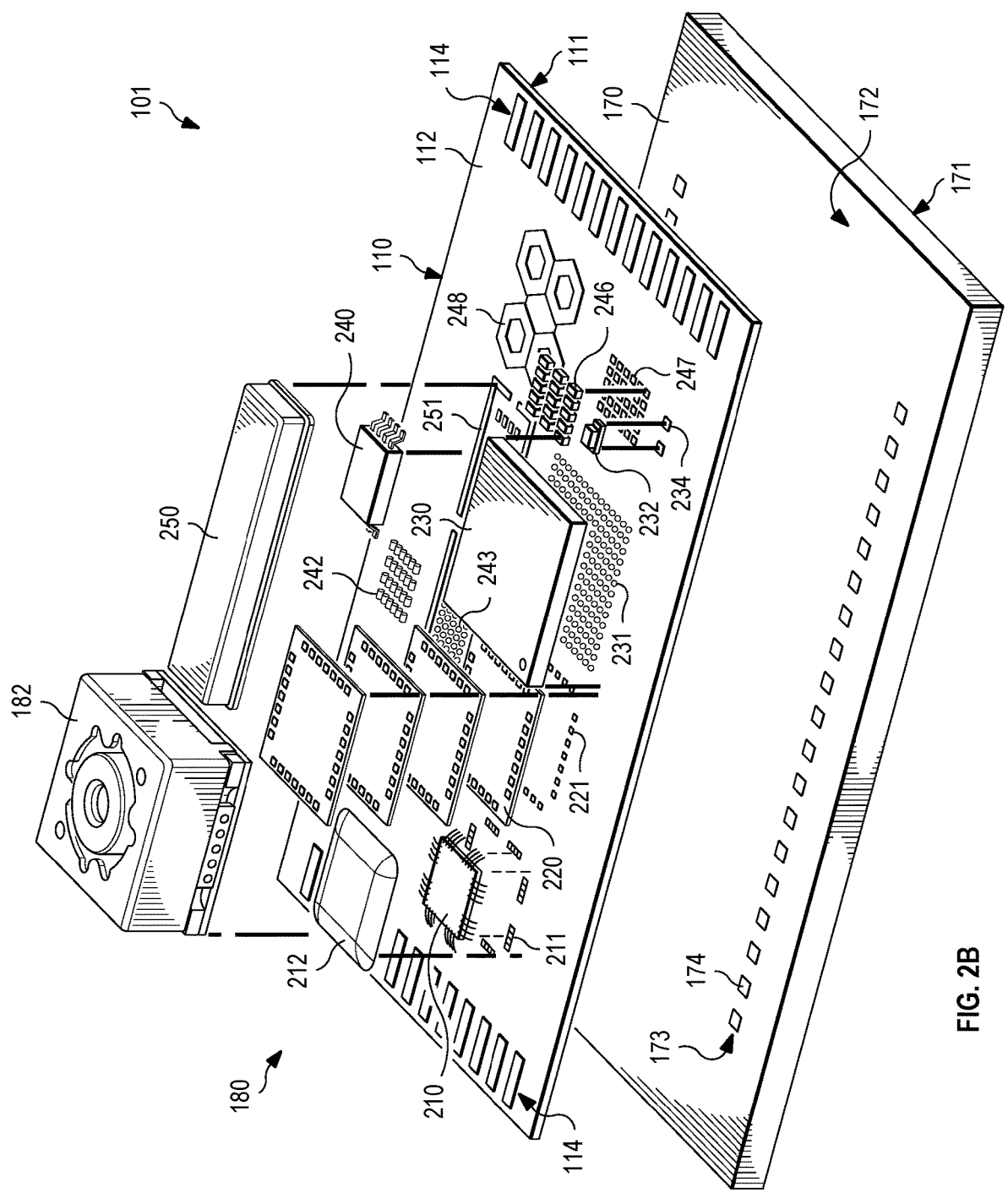
Figure 2C:
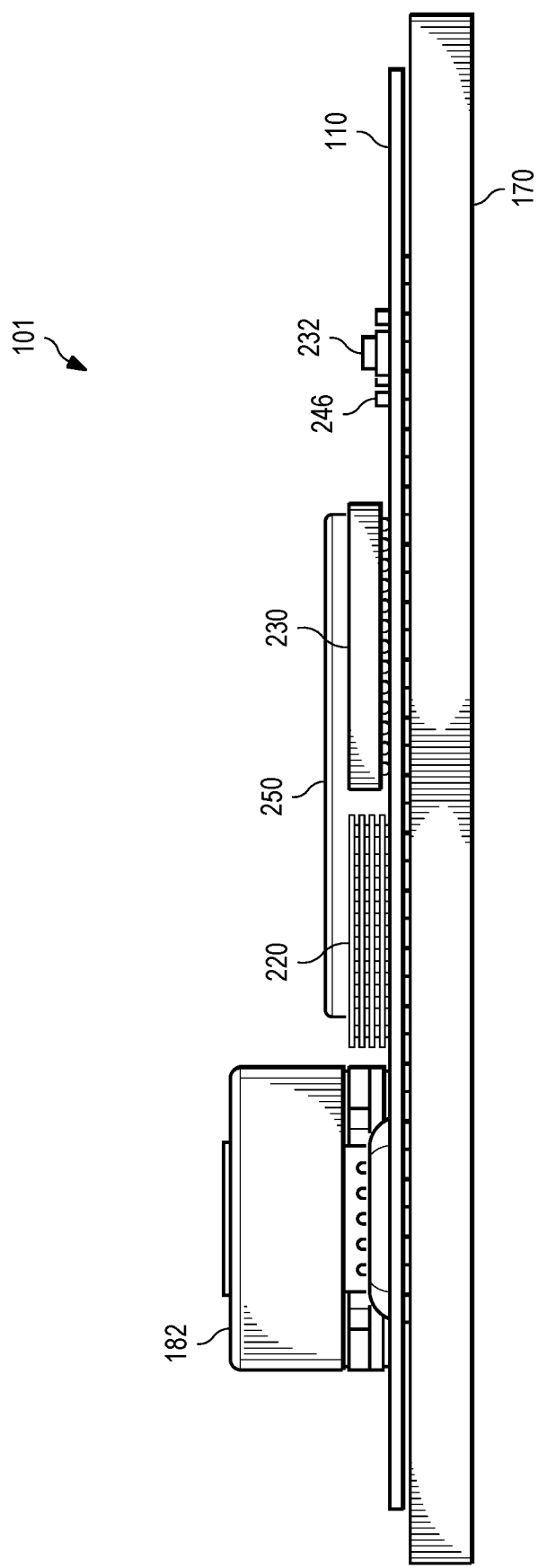

FIGS. 2A-2C illustrate different views of the substrate 110 coupled to the display subassembly 170 to produce a bonded circuit board/display assembly 101. FIG. 2A provides a perspective view, FIG. 2B provides an exploded perspective view, and FIG. 2C provides a cross-sectional view. The substrate 110 shown in FIGS. 2A-2C includes a variety of exemplary components 180 that could be mounted onto the substrate 110, but this is intended to be illustrative and in other embodiments, greater, fewer, or different components 180 could be mounted onto the substrate 110.

As described above, the camera module 182 can be mounted onto the substrate 110 and electrically coupled to the substrate 110 via one or more contact pads 261 formed on the second side 112 of the silicon circuit board substrate 110. The contact pads 261 may make electrical contact to corresponding contacts of the camera module 182. An image sensor (not shown) may also be electrically and mechanically connected to the second side 112 of the substrate 110, or may be integrated into the camera module 182. The image sensor may comprise any type of image capturing element that converts an optical image into an electronic signal, such as, e.g., a charge-coupled device (CCD) or complementary metal-oxide-semiconductor (CMOS) active pixel sensor. The camera module may further comprise a voice coil motor (VCM) (not shown) or other electromechanical device electrically and mechanically coupled to the substrate 110 to move the lens assembly (not shown) of the camera module 182 for the purpose of focusing an image on photosensitive elements of the image sensor. The VCM may have electrical contacts that may make electrical contact with corresponding contacts 261 of the substrate 110, and may be configured to receive one or more AF control signals via those contacts 261 to move the lens assembly based at least in part on the received AF control signals. It will be appreciated that while the camera module autofocus is described with relation to a VCM, any suitable electromechanical device that may be used to displace the lens assembly may be used. Other electromechanical devices may include piezomotors, MEMS based deflectors, or the like. The lens assembly of the camera module 182 may include one or more optical elements, such as one or more lenses and/or mirrors. In some example embodiments, the camera module 182 includes only a single lens. The camera module 182 may be mechanically attached to the substrate 110 by any suitable mechanism, including, for example epoxy material. The camera module 182 may be aligned, such as by a pick-and-place process performed by a pick-and-place system, over the contact pads 261 on the substrate 110.

One or more chip-on-board mounted processors 210 may also be directly mounted to the substrate 110. These processors 210 may include a plurality of contact pads that can be wire bonded to corresponding contacts 211 on the second side 112 of the substrate 110. These processors 210 may comprise any kind of component suitable for chip-on-board mounting, such as, e.g., a central processing unit (CPU) microprocessor, a microcontroller, or other processor component. A protective molding 212 may be formed over the processors 210 to provide electrical and mechanical protection for the processors 210 and the wire bonds. This protective molding 212 may comprise any suitable protective material, as is well known in the semiconductor processing art, such as, e.g., a potting compound or glop-top epoxy or resin conformal coating deposited over the processor 210 and its wire bonds.

One or more flip-chip packages may also be directly mounted to the substrate 110. In the embodiment illustrated in FIGS. 2A-2C, a TSV flip-chip memory package 220 is mounted onto the substrate 110 and electrically coupled to TSV contacts 221 on the second side 112 of substrate 110.

One or more surface-mount packages may also be directly mounted to the substrate 110. In the embodiment illustrated in FIGS. 2A-2C, a ball grid array (BGA) controller module 230 is mounted onto the substrate 110 and electrically coupled to contact pads 231 on the second side 112 of substrate 110. The BGA module 230 may be electrically coupled to the substrate 110 using any suitable process, e.g., soldering, thermal compression (TC) bonding, or thermosonic bonding (TSB). Other components that could be mounted to the substrate 110 using surface-mount technology (SMT) include, e.g., micro BGA packages, chip scale packages (CSP), or flip-chip packages. One challenge when attempting to mount bare die packages onto conventional PCB motherboards is that these bare die packages often require very fine pitch contacts. The line spacing required by bare die packages can require that the PCB be provided many additional layers, e.g., twelve or more layers, in order to accommodate the required line spacing. A "fan-out" of conductive traces on the surface of the PCB may be required in order to make the desired interconnections with the bare die or surface-mount package. In contrast, silicon circuit board substrate 110 can be easily formed with the desired interconnections and line spacing without resulting in a substantial increase in the thickness of the substrate, as would be the case with a PCB having many layers. In addition, "fan-out" conductive traces would not be required because the contact pads can be formed on the silicon substrate 110 with extremely tight line spacing and small contact pads. Because the substrate 110 is formed from a silicon die, components may alternatively be coupled to the substrate 110 using bare die bonding instead of SMT. This can decrease the size of the assembly as well as simplify and reduce the cost of manufacturing.

One or more electromagnetic interference (EMI) shields 250 may be used to provide EMI shielding for various components 180 on the substrate 110. Conventional PCBs sometimes have poor planarity, which can be made worse if the PCB warps over time. In devices utilizing PCBs, the EMI shields are soldered to the surface of the PCB, but can detach from the PCB due to this poor planarity or warping. In contrast, a substrate 110 can be made from a silicon die with a high degree of flatness (e.g., +/−µm), which can improve yield during the initial attachment of the shield to the substrate. In addition, silicon substrates 110 do not experience warpage like PCBs, so the risk of the shield detaching later is also reduced. In one embodiment, the shield 250 can be attached to the surface of the substrate 110 using solder paste printing, in which a solder paste is stencil printed onto the surface of the substrate 110, the EMI shield 250 is placed onto the printed solder 251, and a soldering reflow process is performed by placing the substrate 110 with shield 250 in a reflow oven.

In the illustrated embodiment, the EMI shield 250 covers a Small Outline Integrated Circuit (SOIC) package 240, which is SMT mounted to the substrate 110 and coupled to corresponding contact pads 241 on the substrate 110. The SOIC package 240 could be, for example, a Thin Small Outline Package (TSOP), plastic small-outline package (PSOP), shrink small-outline package (SSOP), thin-shrink small outline package (TSSOP), thin very small-outline package (TVSOP), or other similar electronics package. These packages could be, for example, a controller package containing logic to control the operation of one or more components of the device 100. These SMT mounted components may be attached to the substrate 110 using any suitable surface mount mechanism, such as, e.g., pick-and-place with thermocompression solder joints or thermosonic gold-to-gold (Au/Au) bonding.

In addition, the EMI shield 250 also covers a first set of passive components 242. The passive components 242 may comprise, e.g., resistors, capacitors, and inductors. The passive components 242 may be coupled to the component contacts 243 formed on the substrate 110, thereby electrically coupling the passive components 242 with the image sensor die or camera module 182. In other embodiments, any desired type of electronic component may be EMI shielded, such as wireless communication modules, e.g., WiFi and RF modules.

Additional passive components 246 not covered by the EMI shield 250 may be coupled to contact pads 247 on the substrate 110. In some embodiments, the passive components in the device 100 may include integrated passive components (IPC) 248, which are formed in or on the silicon substrate 110. The IPCs 248 may comprise, for example, a resistor formed by a serpentine (e.g., long and narrow) metal line or an inductor formed as a nested serpentine metal line formed in a metal interconnect layer of the substrate 110. As still another example, the IPCs 248 may comprise a capacitor formed as two metal plates on two different metal interconnect layers of the substrate 110. In other example embodiments, the IPCs 248 may be formed in the silicon substrate level, rather than, or in addition to, metal interconnect levels. In these embodiments, doped elements on the silicon substrate 110 may be made and contacted using, for example, refractory metal plugs.

The mounting of chip-on-board components may be more easily achieved by using the silicon circuit board substrate 110. For example, a bare die LED 232 may be attached to the substrate 110 and wire bonded to contact pads 233.

In some embodiments, the substrate 110 may include additional interfaces 114 for coupling with external components or other boards within the device 100. The additional interface 114 may be, e.g., a flex cable interface comprising a set of bond pads for coupling with a flex cable (not shown). This flex cable can then be coupled to a PCB or other components of the device 100, such as, e.g., the battery module 102. The flex cable could be attached to the bond pads using, e.g., ACF or ACP. If a flex cable is coupled to a conventional PCB in this way, failures in the interface may occur due to warpage or nonplanarity of the PCB. Because the silicon substrate 110 has a high planarity and is resistant to warpage, these problems can be avoided.

Figure 3A:
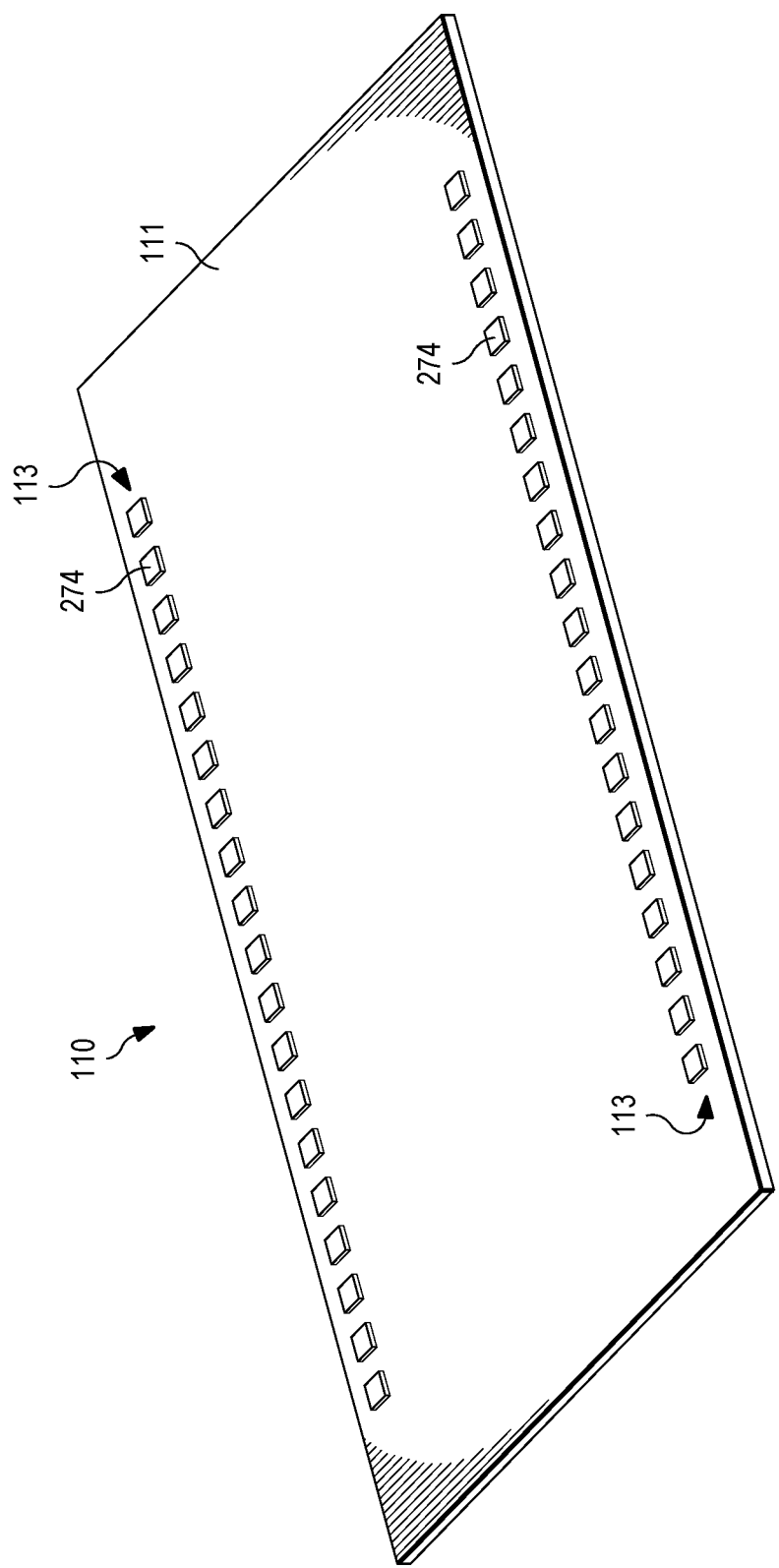
FIGS. 3A-3B are perspective views of the first side and second side, respectively, of a silicon circuit board substrate, in accordance with embodiments of the disclosure.
Figure 3B:
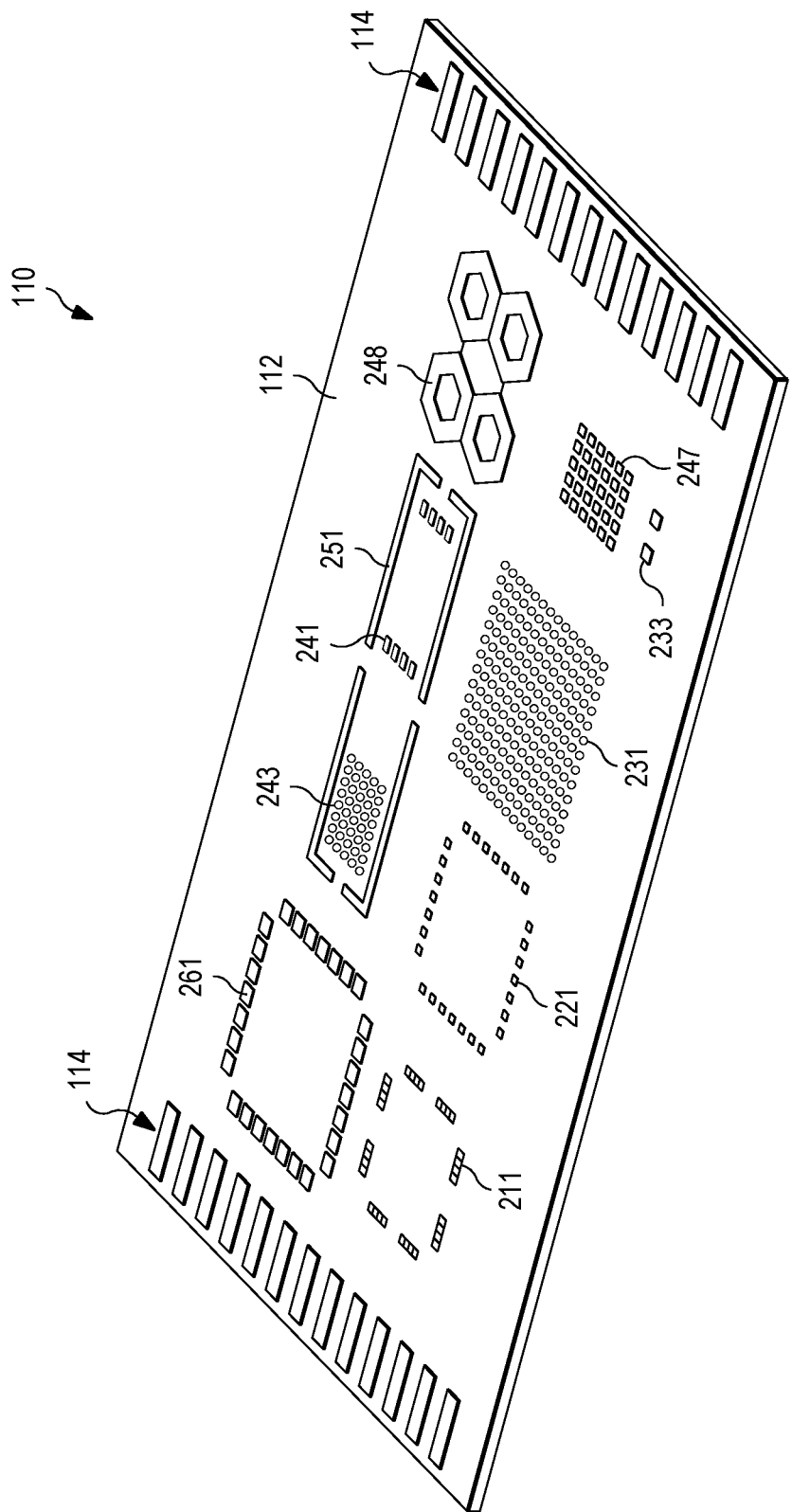

FIGS. 3A-3B are perspective views of the first side 111 and second side 112, respectively, of the substrate 110, before the electronic components are mounted thereon. As can be seen in FIG. 3A, the first side 111 of the substrate 110 includes an electrical interface 113 comprising two rows of substrate contact pads 274, which are arranged to be coupled with corresponding display contact pads 174 in the electrical interface 173 on the second side 172 of the display subassembly 170. The substrate contact pads 274 could be formed using any desired process, such as, e.g., the formation of TSV pads on the first side 111 of the substrate 110, with the TSV pads operatively coupled to interconnects provided on the second side 112 of the substrate 110. The contact pads 274 of the substrate 110 could be operatively coupled to the display contact pads 174 on the display subassembly 170 using any desired interconnection technology, such as, e.g., by forming gold stud bumps on the contact pads 274 of the substrate 110, then bonding gold contacts on the display subassembly 170 to the gold stud bumps on the substrate 110 using, e.g., a thermosonic or thermocompression process. Alternatively, an ACP or ACF layer may be used to couple the contact pads 174, 274.

The use of ACP or ACF layers to bond the substrate 110 to the display subassembly 170 may be particularly desirable because the ACP and ACF bonding processes do not require the application of high levels of heat. Many components mounted on the substrate 110, such as the camera module 182, may be sensitive to high heat. A high temperature bonding process such as soldering may require that the substrate 110 be exposed to greater than 250° C. This could cause damage to the lens or other components on the substrate 110. In contrast, ACP and ACF bonding processes may be performed at less than 150° C., with the heat being localized to the regions being bonded; the rest of the substrate 110 and components mounted thereon may not be subjected to this heat.

In some embodiments, an additional adhesive layer 190 between the substrate 110 and the display subassembly 170 may be used to provide a stronger mechanical bond between the two surfaces. For example, an epoxy adhesive may be deposited onto a portion of the substrate 110 not otherwise used for electrical connections with the display subassembly 170. A thermal curing step may then be used to cure the adhesive. Alternatively, a pressure sensitive adhesive may be used to mechanically couple the substrate 110 and the display subassembly 170.

As described above, the silicon substrate 110 can be manufactured to have a high degree of flatness with little or no warpage. In addition, the second side 172 of the display subassembly 170 may comprise a glass sheet, which can also be manufactured with a high degree of flatness with little or no warpage. Because of the planarity of the two sides 111, 172, the substrate 110 can be flip-chip bonded to the display subassembly 170, even when using substrates 110 having a relatively large surface. Because of the similarity of the coefficients of thermal expansion for the silicon substrate 110 and the glass sheet of the display subassembly, the contact pads 174, 274 can retain their electrical connection even under changing environmental conditions. In one embodiment, a tablet computing device having an 8" display may utilize a display subassembly having a side 172 with a surface area having dimensions of approximately 7"×4.5". The side 111 of the silicon substrate 110 coupled with the display subassembly 170 could have a surface area with the same dimensions or slightly smaller dimensions than the side 172, e.g., approximately 6"×3", approximately 3"×3", approximately 4"×2", or any desired form factor. A conventional 6"×3" PCB would be far too nonplanar and subject to differing thermal expansion to be flip-chip bonded to the display subassembly 170. However, a 6"×3" silicon circuit board substrate in accordance with embodiments of the present disclosure could be made with a sufficient degree of flatness to form a reliable connection with the display subassembly 170 using, e.g., flip-chip bonded gold stud bumps.

The use of a silicon circuit board substrate 110 bonded to the display subassembly 170 may provide additional advantages. The bonding of the substrate 110 to the display subassembly 170 can provide structural support and protection for the substrate 110, which can enable the use of thin silicon substrates, even substrates having a thickness of less than about 1.0 mm, e.g., about 0.7 mm, about 0.3 mm, about 0.2 mm, or any other desired thickness. The likelihood of damage when the device 100 is subjected to physical stress may be reduced because the durable glass layer of the display subassembly protects the fragile substrates. In addition, the fabrication of a silicon substrate 110 can be performed with a much higher yield rate than the fabrication of PCB, e.g., a greater than 99% yield for silicon substrates versus approximately 80%-85% yield for PCB fabrication. A further advantage is that fewer contaminants may be introduced when fabricating silicon substrates versus PCBs, which can result in a reduction in the defect rate during manufacturing.

In embodiments described above, the electrical connection between the substrate 110 and the display subassembly 170 may be formed using electrical interfaces formed on the sides 111, 172 that are also mechanically bonded together. In other embodiments, the electrical connection between the substrate 110 and the display subassembly 170 may be formed in any other desired location, including using electrical interfaces provided on the second side 112 of the substrate 110 and/or the first side 171 of the display subassembly 170. If the electrical interfaces are not provided in the regions where the substrate 110 and display subassembly 170 are coupled, then other types of electrical interconnections may be used, e.g., flex cable, wire bonding, etc.

Figure 4:
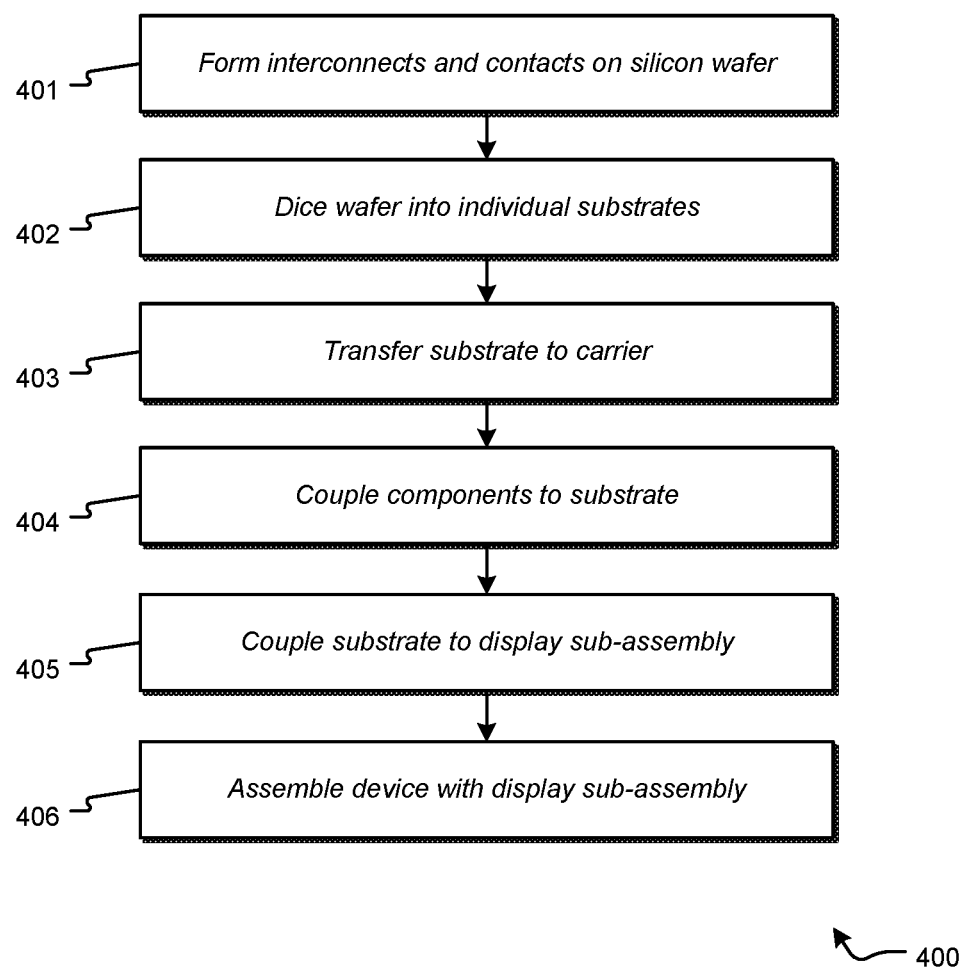
FIG. 4 is a flowchart illustrating a method of manufacturing an electronic device with a silicon circuit board substrate, in accordance with embodiments of the disclosure.

FIG. 4 is a flowchart illustrating a method 400 of manufacturing an electronic device 100 with a silicon circuit board substrate 110, in accordance with embodiments of the disclosure.

In step 401, a silicon wafer is provided, and the desired interconnect and contact structures are formed on the wafer. Any size wafer may be used, such as, e.g., a 12" wafer. The topmost layer of the silicon wafer may comprise, e.g., an aluminum nitride passivation layer. The various contacts on the surface of the silicon wafer may be formed using, e.g., under bump metallization (UBM), followed by an electroless nickel immersion gold (ENIG) plating. Fiducial marks may also be formed on the surface of the silicon wafer to facilitate machine vision alignment of the substrates 110 with the various components 180 to be mounted to the substrate 110 in subsequent steps below.

In step 402, the silicon wafer is diced into individual substrates 110 in the desired size, e.g., 3"×3". In step 403, the individual substrates 110 are transferred to and bonded onto a protective chip carrier for handling during subsequent manufacturing steps. In step 404, the various components 180 are coupled to the second side 112 of the substrate 110, and in step 405, the substrate 110 is coupled to the display subassembly 170, as described above with respect to FIGS. 1, 2A-2C, and 3A-3B.

In step 406, the display subassembly 170 and the attached substrate 110 are assembled into the housing 120 of the device 100. The interface 114 of the substrate 110 may be coupled with the other desired components of the device 100.

Figure 5A:
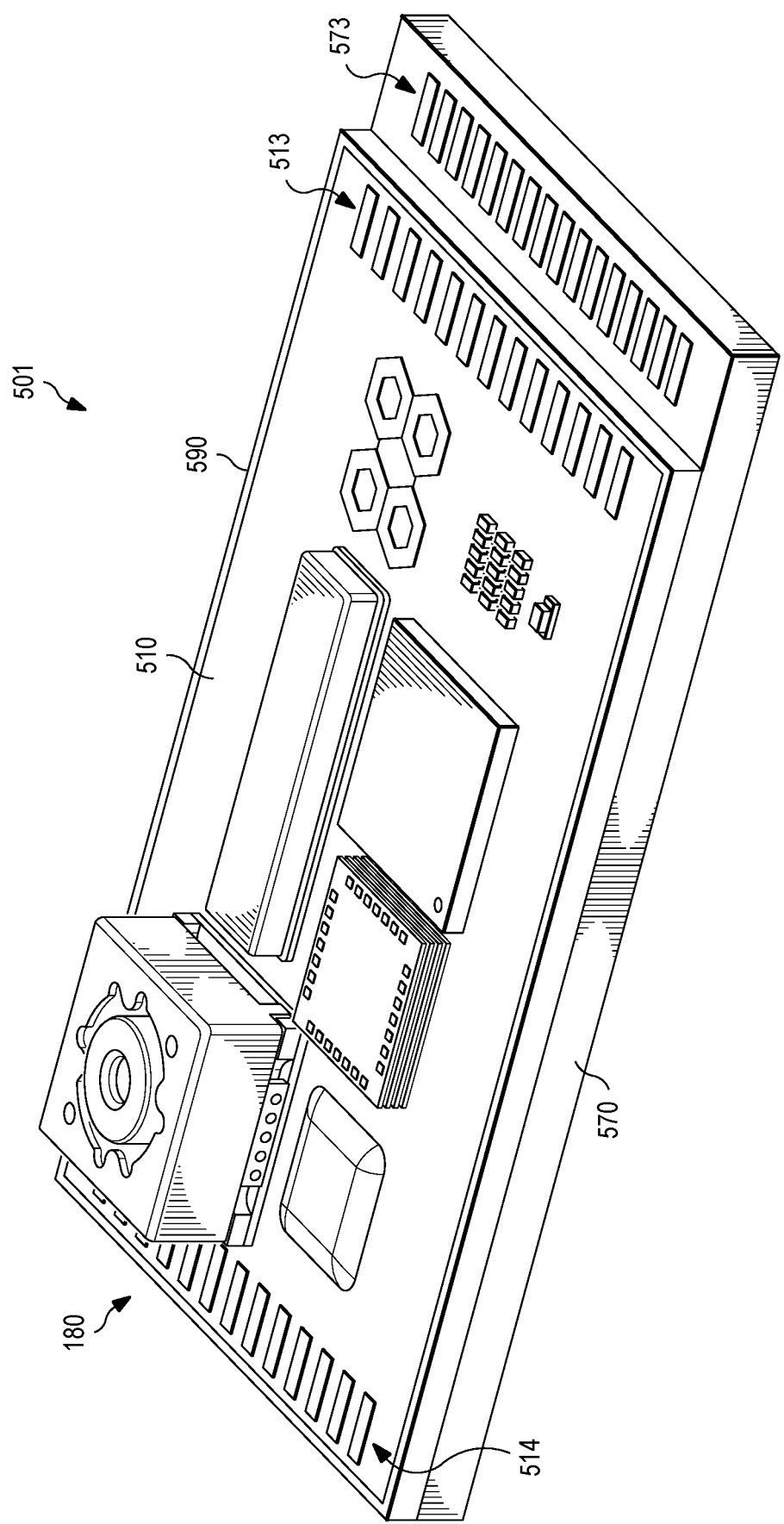
FIGS. 5A-5B illustrate perspective and exploded views, respectively, of a bonded circuit board/display assembly in which a silicon circuit board substrate is coupled to a display subassembly with a reinforcing member interposed therebetween, in accordance with embodiments of the disclosure.
Figure 5B:
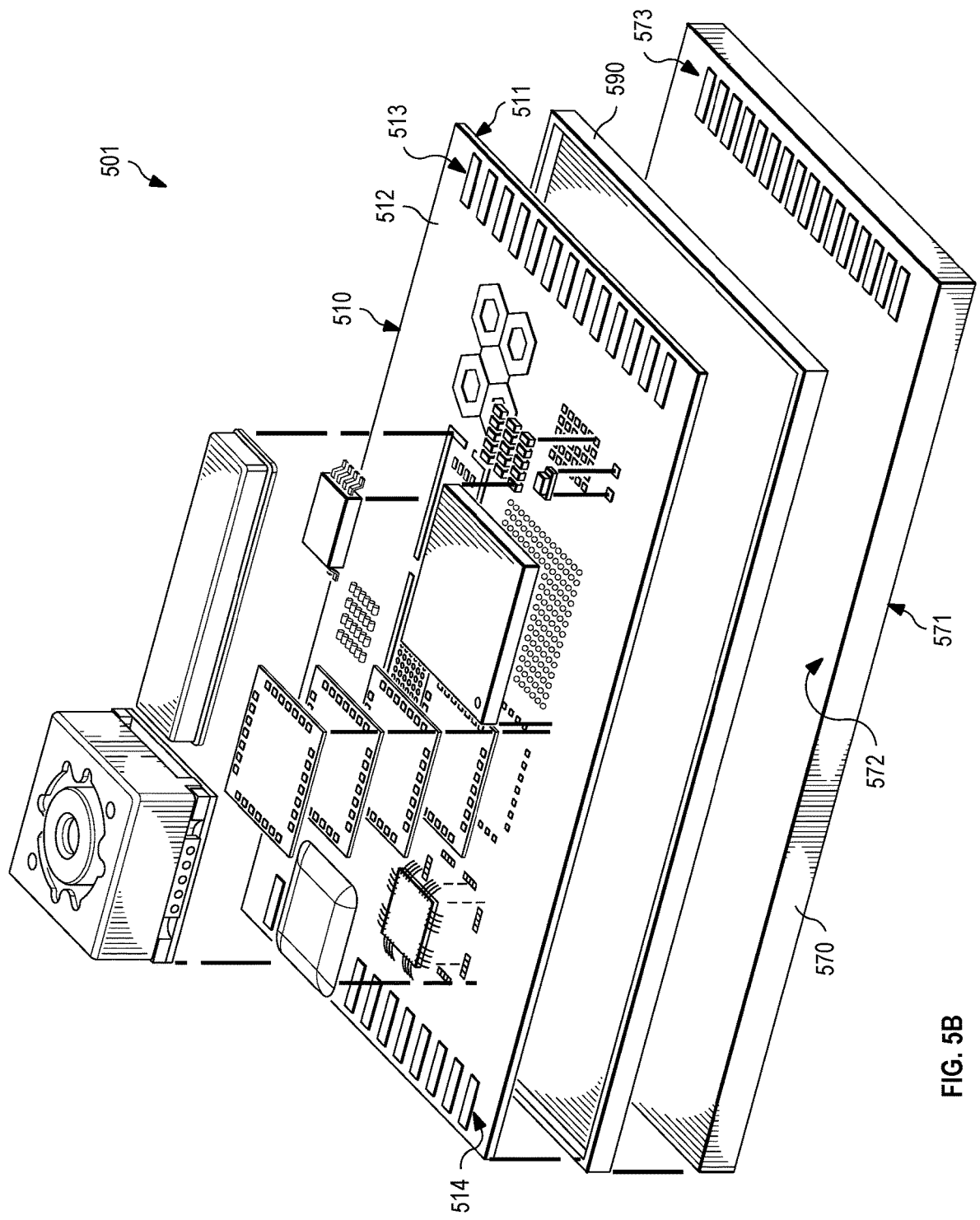

In accordance with other embodiments of the present disclosure, the silicon circuit board substrate is not directly coupled to the display subassembly. Instead, a separate reinforcing member may be coupled to the substrate, and the reinforcing member is, in turn, directly adhered to the display subassembly, using, e.g., an adhesive layer. FIGS. 5A-5B illustrate perspective and exploded views, respectively, of a bonded circuit board/display assembly 501 in which a substrate 510 is coupled to a display subassembly 570 with a reinforcing member 590 interposed therebetween. The illustrated assembly 501 is similar to the assembly 101, except as described below. The various components 180 used in the assembly 501 and the methods by which they are coupled to the substrate 510 may be the same as described above with respect to FIGS. 1-4, and further description regarding that aspect of this embodiment is omitted below.

In embodiments described above, the display subassembly 170 is directly coupled to the substrate 110 and provides structural support and protection for the substrate 110. In the embodiment illustrated in FIGS. 5A-5B, the structural support and protection for the substrate 510 is instead provided by reinforcing member 590.

The reinforcing member 590 may comprise any suitable material and may be coupled to the substrate 510 in a variety of ways. For example, the reinforcing member 590 may be made of thermosetting polymer materials, and a liquid molding process may be performed, where thermosetting polymer materials are deposited on the first side 511 of the substrate 510. The reinforcing member 590 shown in FIGS. 5A-5B is formed on the first side 511 and the edges of the substrate 510 to provide additional protection for the fragile edges of the substrate 510 from physical damage. This can be accomplished by providing defined gaps in the protective chip carrier holding the substrate die and then depositing the molding compound over the die and into those gaps around the edges of the substrate 510. The substrates 510 can then be diced again to separate adjacent substrates 510, which may be molded together. In other embodiments, the reinforcing member may be formed only on the first side 511 of the substrate 510 and not on the edges, or on fewer than all of the edges. In some embodiments, the molding process (e.g., template, thermosetting material deposition, cure, etc.) to fabricate the molding to form the reinforcing member may be performed at the wafer level prior to die singulation.

In other embodiments, the reinforcing member 590 may comprise a different material, such as, e.g., a metal, composite, polymer, or laminate, that provides sufficient rigidity and protection for the substrate 510. The reinforcing member 590 may comprise, for example, a sheet of metal having a thickness of approximately 0.15 mm to 0.20 mm and adhered to the first side 511 of the substrate 510.

The reinforcing member 590 may be coupled to the display subassembly 570 using any suitable adhesive, such as, e.g., a pressure sensitive adhesive.

In assembly 501, the contact pads of the substrate 510 for connection with the display subassembly 570 are not provided on the regions of the first side 511 of the substrate 510 covered by the reinforcing member 590. Instead, an electrical interface 513 for coupling with the display subassembly 570 is provided on the second side 512 of the substrate 510. In the illustrated embodiment, a portion of the second side 572 of the display subassembly 570 is not covered by the reinforcing member 590. This exposed portion of the display subassembly 570 may include an electrical interface 573 for coupling with the electrical interface 513 of the substrate 510. In some embodiments, the substrate 510 includes one or more additional interfaces 514 for coupling with external components. The additional interface 514 may be, e.g., a flex cable interface comprising a set of bond pads for coupling with a flex cable (not shown). This flex cable can then be coupled to a PCB or other component of the device, such as, e.g., the battery module. The electrical interfaces 513, 514, 573 may comprise, e.g., an array of contact pads, bond pads, or other interconnect structure for making electrical contact with corresponding contact pads on the other interface.

In other embodiments, the electrical interface 573 may be provided on the first side 571 or edges of the display subassembly 570. This may be desirable if forming the electrical interface 573 on the second side 572 of the display subassembly 570 is not possible, prohibitively expensive, or otherwise undesirable. This can also enable the use of off-the-shelf display subassemblies without any customization of the interface 573.

Figure 6:
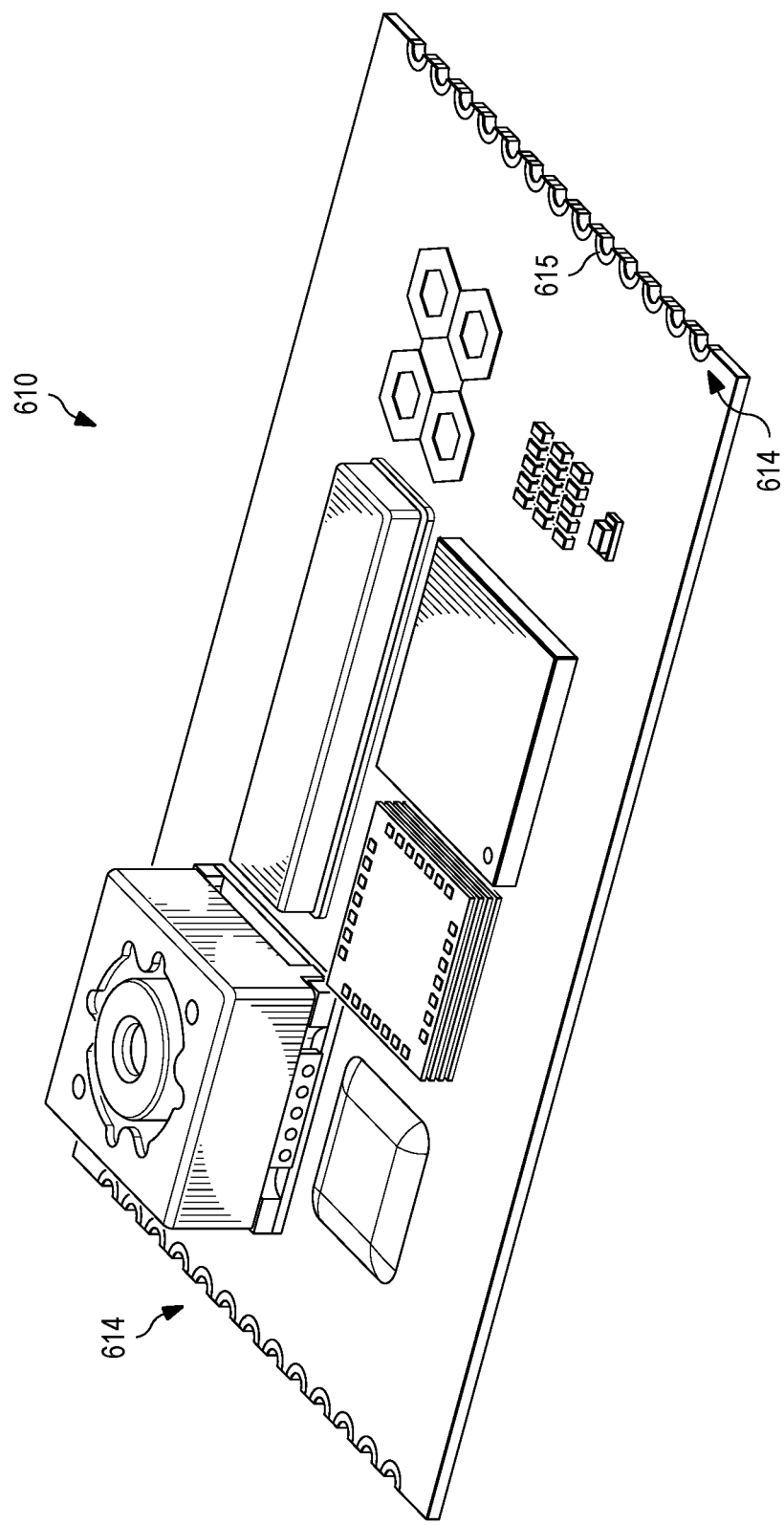
FIG. 6 illustrates a perspective view of a silicon circuit board substrate with castellated edge contacts, in accordance with embodiments of the present disclosure.

FIG. 6 illustrates a perspective view of a silicon circuit board substrate 610 with castellated edge contacts in accordance with other embodiments of the present disclosure. In the illustrated embodiment, the electrical interfaces 614 of the silicon circuit board substrate 610 comprise edge contacts 615 with a castellated shape. The castellated contacts 615 at the edge of the substrate 610 may be used to make electrical and mechanical contact with electrical pins (e.g., electrical leads of pin contacts) on the display subassembly or an interposer board (e.g., a PCB interposer, as described below with respect to FIGS. 7A-7B).

Figure 7A:
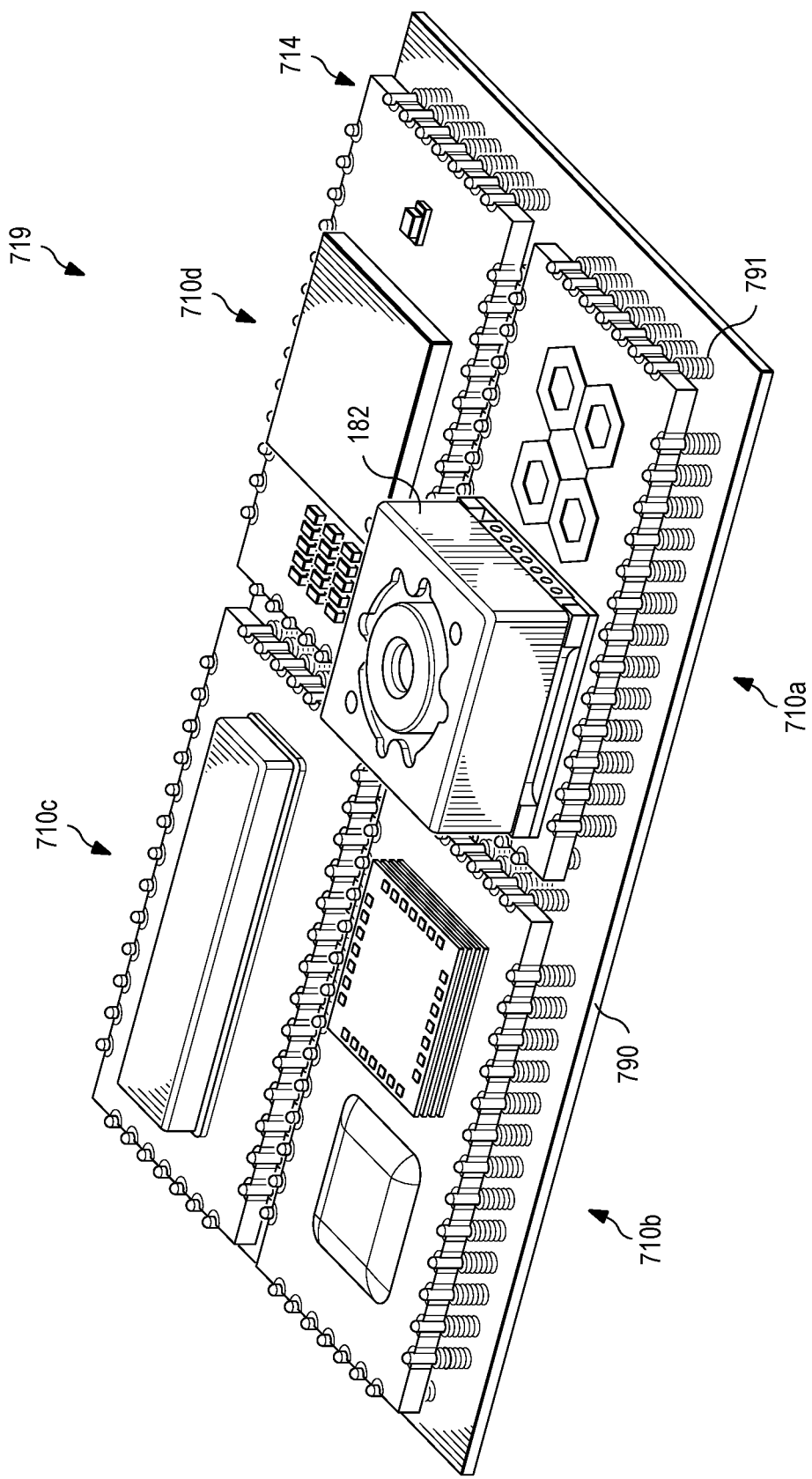
FIGS. 7A-7B illustrate perspective and exploded perspective views, respectively, of a modular circuit board subassembly including modular silicon circuit board substrates having castellated edge contacts, in accordance with embodiments of the present disclosure.
Figure 7B:
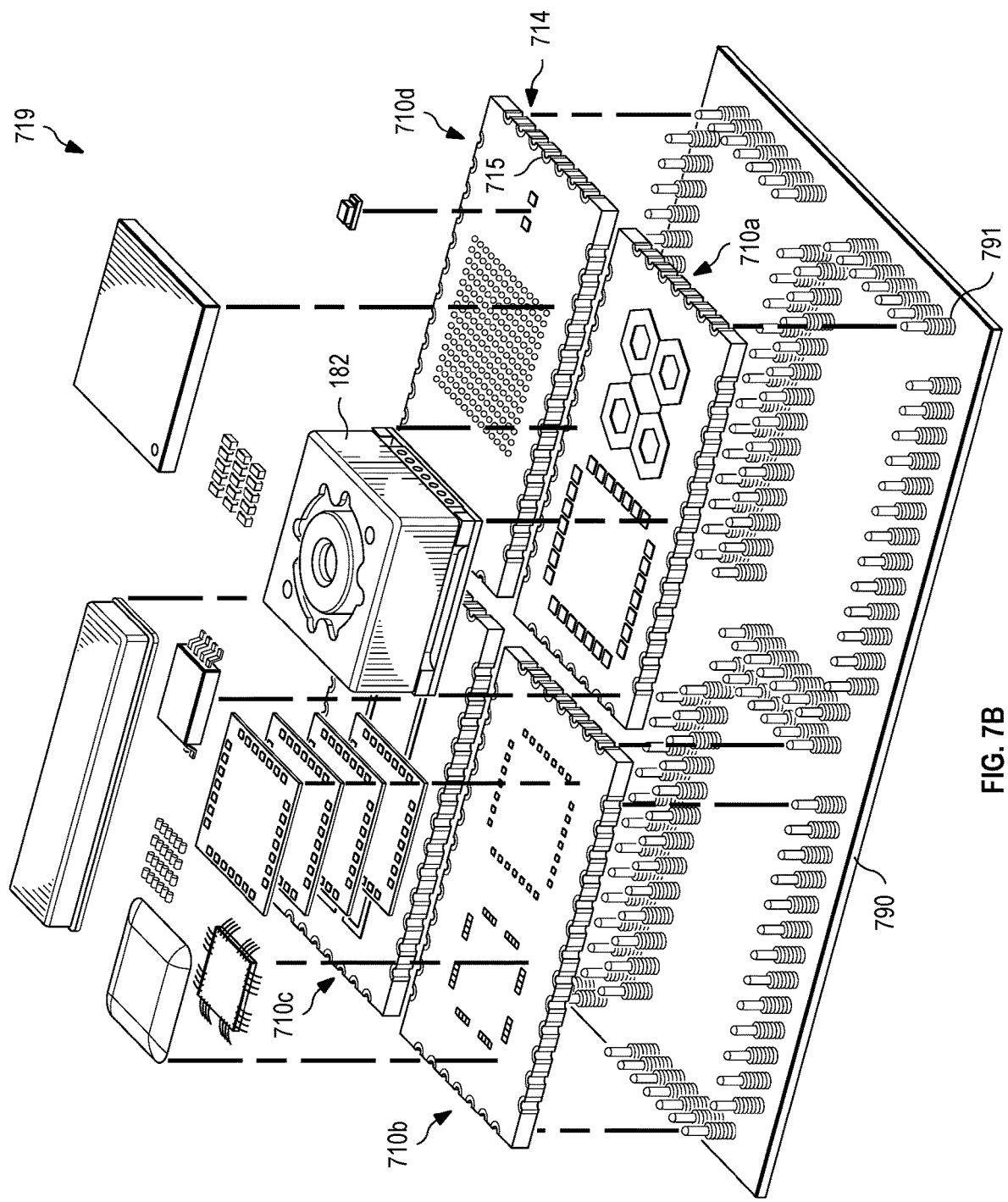

FIGS. 7A-7B illustrate perspective and exploded perspective views, respectively, of a modular circuit board subassembly 719 including modular silicon circuit board substrates 710a-710d having castellated edge contacts, in accordance with other embodiments of the present disclosure. Similar to the embodiment shown in FIG. 6, the electrical interfaces 714 of the silicon circuit board substrate 710 comprise edge contacts 715 with a castellated shape.

In the substrate 610 in FIG. 6 as well as the modular substrates 710a-710d in FIGS. 7A-7B, the castellated contacts 615, 715 at the edge of the substrate 610, 710 may be used to make electrical and mechanical contact with electrical pins 791 (e.g., electrical leads of pin contacts) on a PCB interposer board 790 (shown in FIG. 7). The illustrated assembly 601 is similar to the assembly 101, except as described below. The various components 180 coupled to the substrates 610, 710 and the methods by which they are coupled to the substrates 610, 710 may be the same as described above with respect to FIGS. 1-4, and further description regarding those aspects of these embodiments is omitted here.

Figure 8:
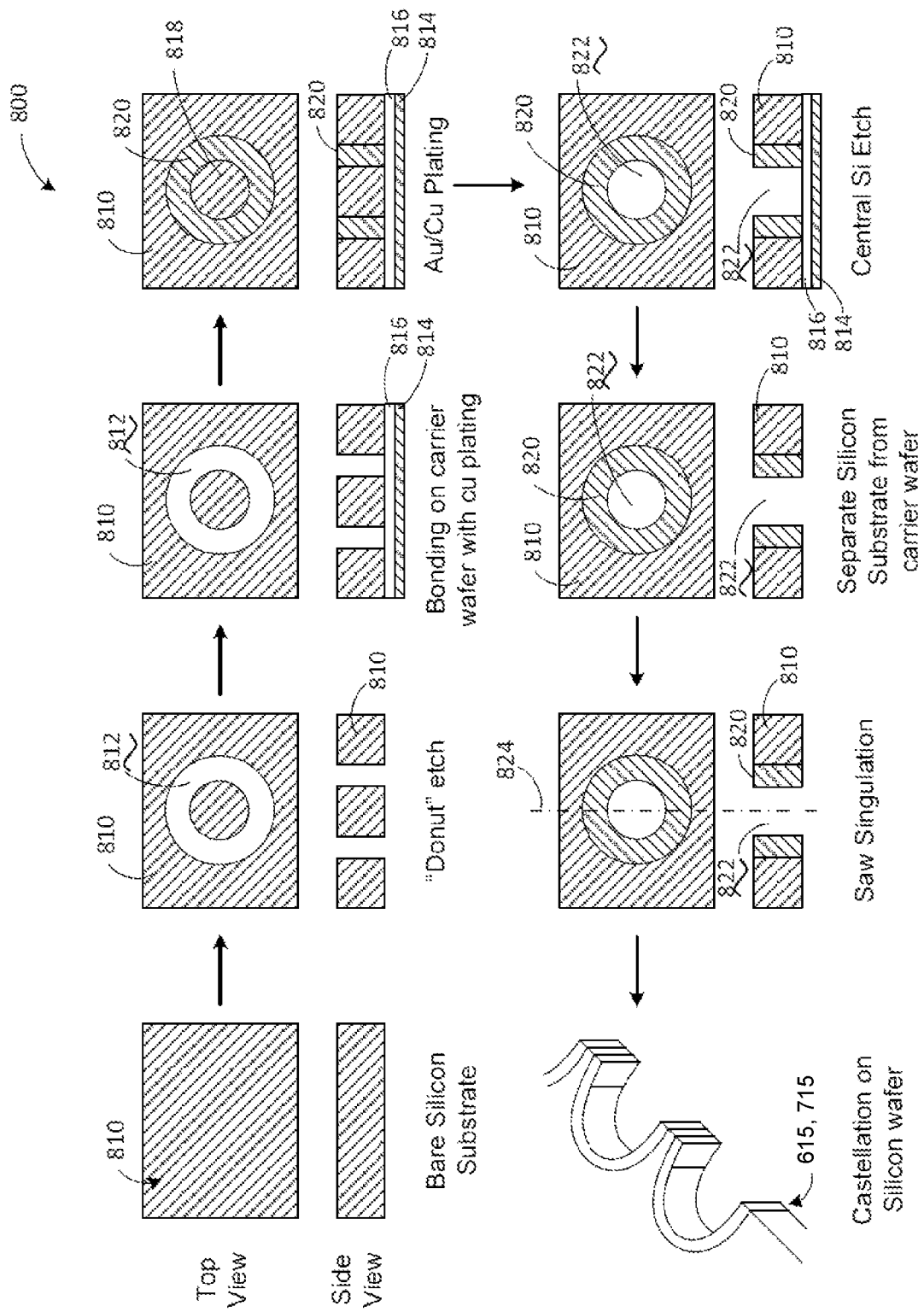
FIG. 8 illustrates an example method for fabricating castellated edges of silicon circuit board substrates, in accordance with embodiments of the disclosure.

FIG. 8 illustrates an example method for fabricating castellated edges of the substrates 610, 710, in accordance with embodiments of the disclosure. Bare silicon substrate 810 may initially be provided. In example embodiments, the silicon substrate may have other patterns and/or interconnects formed thereon. Therefore, in these embodiments, the formation of the castellated contacts 615, 715 may be similar to a TSV last-type of integration sequence. Alternatively, when starting with bare, unpatterned silicon, the formation of the castellated contacts 615, 715 may be similar to a TSV first-type integration. The bare silicon substrate 810 may be any suitable substrate, such as a 12" silicon wafer. The substrate 810 may comprise, e.g., oriented crystalline silicon, oriented silicon, or polysilicon. Alternatively, the substrate 810 may comprise a non-silicon material, such as glass, sapphire, quartz, or other suitable substrate materials. The substrate 810 may be of any suitable thickness, such as a thickness in the range of about 30 μm (0.03 mm) to about 400 μm (0.4 mm). In example embodiments, the substrate 810 may be thinned prior to commencing the processes of method 800.

A "donut" or annular etch may be performed through the thickness (or partially through the thickness in the case of partially castellated contacts) of the substrate 810. The annular hole 812, in example embodiments, may be formed by any suitable plasma etching (e.g., reactive-ion etching (ME), magnetically enhanced reactive ion etching (MERIE), high density plasma (HDP) etching, etch-passivation-etch, Bosch etch, inductively coupled plasma (ICP) etching, etc.) using either a photoresist mask or a hard mask (e.g., SiO2, Si3N4, etc.) and using any suitable process gas (e.g., SF6, CF4, C2F6, C3F8, C4F8, NF3, O2, CO2, etc.). In other example embodiments, the annular TSV hole 812 may be formed by a laser ablation process. In some example embodiments, the annular TSV hole 812 may be passivated, or in other words, a dielectric liner may be provided on the inside walls of the annular TSV hole 812. This dielectric liner may serve to electrically insulate, or at least partially decouple an electrical signal conducted by the annular TSV from the surrounding conductive and/or semiconducting material of the substrate 810. The dielectric liner, in example embodiments, may be deposited, such as by a tetraethylorthosilicate (TEOS) PECVD deposited SiO2. Alternatively, other materials may be deposited on the inner walls of the annular TSV hole 812 or a SiO2 film may be formed, such as by thermal oxidation of the silicon substrate 810. Once a dielectric liner is provided on the inside of the annular TSV hole 812, the annular TSV hole 812 may be filled with conductive material, such as electroless or electroplated Cu.

The annular hole 812 etched substrate 810 may be bonded onto a carrier wafer 814 with Cu plating 816. The carrier wafer may provide rigidity to the substrate 810 for subsequent processing. The Cu plating 816 may serve as a seed layer for the growth of metal 818 (e.g., Au/Cu) within the annular hole 812. The growth of the metal 820 may be, in example embodiments, an electroless plating process, such as a Cu electroless plating process. In some example embodiments, prior to filling 820 with Cu the annular hole 812, a diffusion barrier or diffusion inhibitor layer may be deposited. In example embodiments, this diffusion inhibitor layer may be a dielectric layer (e.g., Si3N4, SiCN, SiC, SiON, etc.) or a metallic diffusion inhibitor (e.g., Ti, TiN, Ta, TaN, W). After plating 820 the annular via 812 using the seed layer 816 of the carrier wafer 814, the central plug 818 of the substrate material 810 (e.g., the donut hole) may be removed 822. The central substrate plug 818 may be removed using any variety of dry (ME, Bosch, etch-depetch, HDP, etc.) or wet etch (KOH, TMAH, etc.), such as in a template fashion (e.g., photolithography defined etch).

Next, the carrier wafer 814 may be separated from the substrate 810 with the filled annular TSV 820 with a center void 822. As a next process, the substrate may be singulated 824 in a fashion where the substrate 810 may be cut 824 through the annular via 820 and center void 822. In example embodiments, the annular via may be cut 824 substantially through the middle of the annular via 820. In other example embodiments, the cut 824 may be off-center to produce either an elongated or shortened castellated contact, as may be desired. It will be appreciated that to singulate substrate 810 with annular TSVs 820 for castellation contacts 615, 715 fabricated on a wafer, each of the streets between die may be cut more than once (e.g., twice). The singulation process 824 may be conducted using any suitable mechanism, such as sawing or laser cutting. In example embodiments, sawing may be performed at a relatively lower speed to prevent excessive chipping at the edges of the substrate 810, as excessive chipping may lead to poor yield and failure of the castellated contacts 615, 715.

The castellated contacts 615, 715 may be mechanically and electrically coupled to electrical pins 791 on the PCB interposer board 790. Each of the electrical pins 791 may be spring-loaded so as to provide a lateral force against the edges of the substrates 610, 710 to mechanically retain the substrates 610, 710 in place after they are coupled to the interposer board 790, as well as to maintain the electrical coupling between the castellated contacts 615, 715 and the pins 791.

After the substrates 610, 710 are coupled to the interposer board 790, the interposer board 790 may then be coupled to the back side of a display subassembly (not shown). In some embodiments, the electrical interfaces between the interposer board 790 and the display subassembly are provided on the sides that are coupled, similar to the embodiments described above with respect to FIGS. 2A-2C. In other embodiments, the electrical interfaces may be provided on different sides or different regions of the interposer board 790 and the display subassembly, as described above with respect to FIGS. 5A-5B. The PCB interposer board 790 may be made of any suitable material, such as, e.g., FR-4, laminate, polyimide, or other electrical substrate materials.

Embodiments of substrates 610, 710 having castellated contacts 615, 715 can provide certain advantages. For example, if the electrical coupling between the silicon circuit board substrate and the display subassembly is formed using solder, ACP, ACF, or other fixed forms of adhesion, it can be difficult to separate the substrate from the display subassembly to replace just one of those components without damaging the substrate. The castellated contacts 615, 715 provide a removable coupling between the substrates 610, 710 and the display subassemblies, which facilitates easy replacement, if needed.

Embodiments incorporating a modular circuit board subassembly 719, as shown in FIGS. 7A-7B may provide additional advantages. Each of the modular substrates 710a-710d can be individually disconnected from the interposer board 790 without having to disconnect all of the modular substrates 710a-710d. As a result, if only one component 180 fails, only the substrate onto which that component is mounted will need to be replaced. This can significantly reduce the cost of replacing components. In some embodiments, the various components 180 may be mounted onto the modules (e.g., modular substrates 710a-710d) based on similar functionality or interdependent operation. For example, one modular substrate 710a may comprise an imaging modular, and the various components of the device related to the imaging function of the device (e.g., camera module 182) would be mounted onto that substrate 710a. Next, a second modular substrate 710b may comprise a memory module, and the various components of the device related to memory would be mounted onto that substrate 710b. Another modular substrate 710c may comprise a short-range wireless communications module, and the various components of the device related to short-range wireless communications would be mounted onto that substrate 710c. Any desired grouping may be used.

Figure 9:
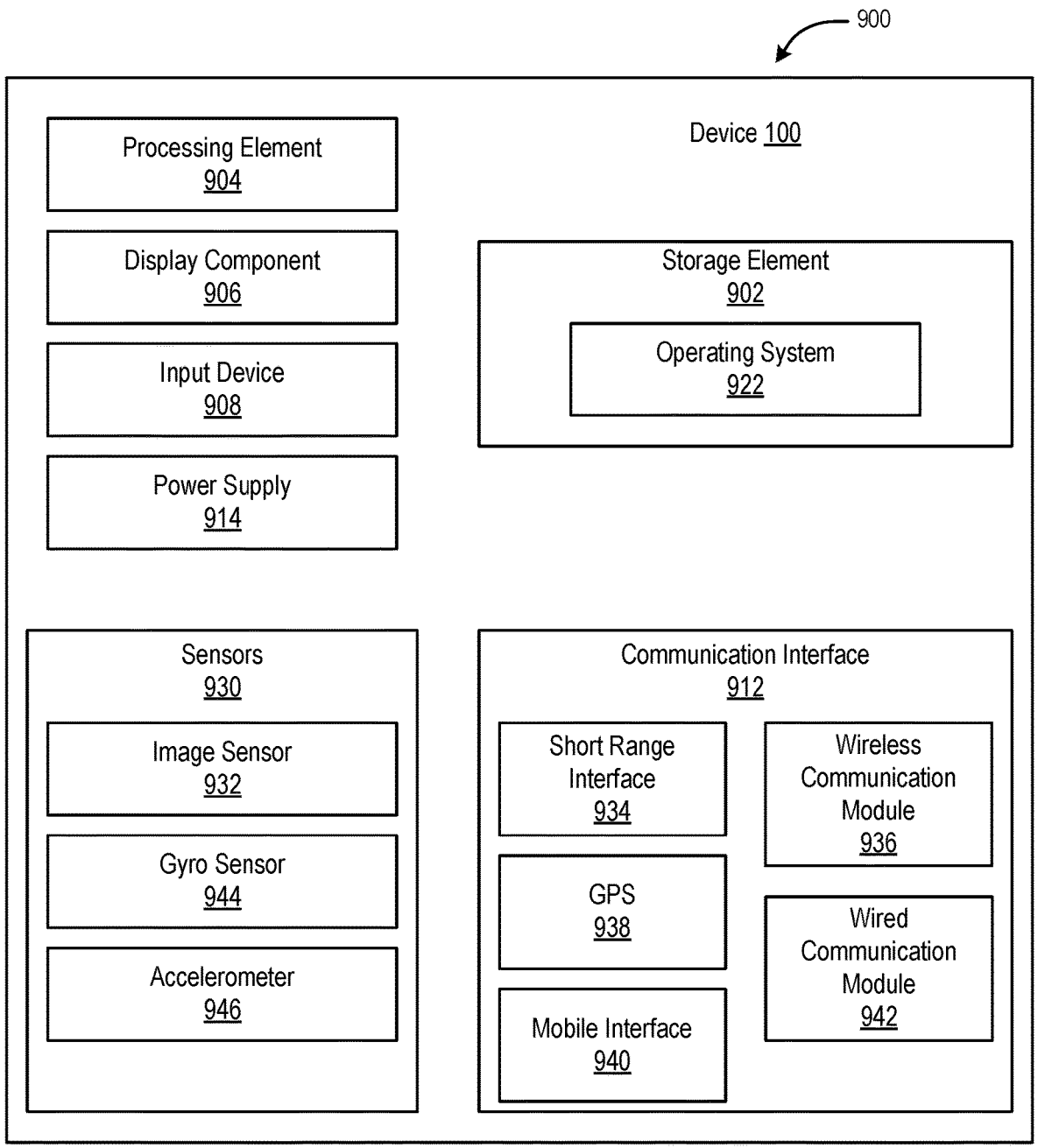
FIG. 9 is a block diagram showing an example architecture of an electronic device, in accordance with embodiments of the present disclosure.

FIG. 9 is a block diagram showing an example architecture 900 of an electronic device 100 that can incorporate embodiments of the present disclosure. It will be appreciated that not all electronic devices will include all of the components of the architecture 900, and some camera systems may include additional components not shown in the architecture 900. The architecture 900 may include one or more processing elements 904 for executing instructions and retrieving data stored in a storage element 902. The processing element 904 may comprise at least one processor. Any suitable processor or processors may be used. For example, the processing element 904 may comprise one or more digital signal processors (DSPs).

The storage element 902 can include one or more different types of non-transitory computer-readable memory, data storage or computer readable storage media devoted to different purposes within the architecture 900. For example, the storage element 902 may comprise flash memory, random access memory, disk-based storage, etc. Different portions of the storage element 902, for example, may be used for program instructions for execution by the processing element 904, storage of images or other digital works, and/or a removable storage for transferring data to other devices, etc. The storage element 902 may also store software for execution by the processing element 904, and an operating system 922 to provide the user with an interface for operating the device 100 and may facilitate communications and commands between applications executing on the architecture 900 and various hardware thereof.

The architecture 900 includes a display component 906. The display component 906 may comprise one or more light emitting diodes (LEDs) or other suitable display lamps. Also, in some examples, the display component 906 may comprise, for example, one or more devices such as cathode ray tubes (CRTs), liquid crystal display (LCD) screens, gas plasma-based flat panel displays, LCD projectors, or other types of display devices, etc.

The architecture 900 may also include one or more input devices 908 operable to receive inputs from a user. The input devices 908 can include, for example, a push button, touch pad, touch screen, wheel, joystick, keyboard, mouse, trackball, keypad, light gun, game controller, or any other such device or element whereby a user can provide inputs to the architecture 900. These input devices 908 may be incorporated into the architecture 900 or operably coupled to the architecture 900 via wired or wireless interface. When the display component 906 includes a touch sensitive display, the input devices 908 can include a touch sensor that operates in conjunction with the display component 906 to permit users to interact with the image displayed by the display component 906 using touch inputs (e.g., with a finger or stylus).

The architecture 900 may also include a power supply 914, such as a wired alternating current (AC) converter, a rechargeable battery operable to be recharged through conventional plug-in approaches, or through other approaches such as capacitive or inductive charging.

The architecture 900 may also include a communication interface 912, comprising one or more wired or wireless components operable to communicate with one or more other computing devices. For example, the communication interface 912 may comprise a wireless communication module 936 configured to communicate on a network according to any suitable wireless protocol, such as IEEE 802.11 or another suitable wireless local area network (WLAN) protocol. A short-range interface 934 may be configured to communicate using one or more short-range wireless protocols such as, for example, near field communications (NFC), Bluetooth™, Bluetooth LE™, etc. A mobile interface 940 may be configured for wireless communications utilizing a cellular or other mobile protocol. A Global Positioning System (GPS) module 938 may be in communication with one or more earth-orbiting satellites or other suitable position-determining systems to identify a position of the device 100. A wired communication module 942 may be configured to communicate according to the Universal Serial Bus (USB) protocol or any other suitable protocol.

The architecture 900 may also include one or more sensors 930 such as, for example, one or more image sensors and one or more motion sensors. A single image sensor 932 is shown in FIG. 9, but multiple image sensors 932 may be used. Motion sensors may include any sensors that sense motion of the device 100 including, for example, gyro sensors 944 and accelerometers 946.

The above-described embodiments may achieve a number of advantages over conventional electronic devices. The overall size of the device may be reduced by replacing a conventional PCB motherboard with a silicon circuit board substrate. This can provide improved manufacturing yields, lower manufacturing cost, and improved durability for the device.

While the invention has been described in terms of particular embodiments and illustrative figures, those of ordinary skill in the art will recognize that the invention is not limited to the embodiments or figures described. In embodiments described above, various components are electrically coupled to other structures, such as the substrate 110. This electrical coupling may be formed using any suitable process, such as, e.g., soldering, ACP, or ACF. In addition, a non-conductive adhesive may be used to mechanically couple those components to the structure to provide additional mechanical reinforcement, thereby reducing the chances of a disconnection when the device is placed under physical stress.

In addition, while embodiments described above utilize an LCD display, other embodiments may utilize other display technologies, e.g., OLED, EPD, EWD, ECD, or other suitable component(s) for displaying content. Moreover, the circuit board substrates need not be attached to a rigid glass layer of a display subassembly. Instead, the circuit board substrates may be attached to a flexible display subassembly. In these embodiments, another protection component, such as a molded stiffener, may be used to provide structural support and protection to the circuit board substrate.

Although the processes, flowcharts, and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. An electronic device, comprising:
a display assembly operable to display content;
a silicon substrate having a first side and a second side, wherein the second side of the silicon substrate comprises at least one component interface comprising one or more of the following: a camera module interface, a memory interface, or a wireless communications interface;
an adhesive layer directly adhering the first side of the silicon substrate to the display assembly; and
one or more of the following:
a camera module electrically coupled to the camera module interface;
a memory module coupled to the memory interface; or
a wireless communications module coupled to the wireless communications.

2. The electronic device of claim 1, wherein:
the display assembly comprises a third side and a fourth side opposite the third side, wherein the fourth side of the display assembly is directly adhered to the first side of the silicon substrate and comprises a first electrical interface; and
the first side of the silicon substrate comprises a second electrical interface coupled to the first electrical interface.

3. The electronic device of claim 2, wherein:
the first electrical interface comprises a plurality of display contact pads; and
the second electrical interface comprises a plurality of substrate contact pads, each substrate contact pad being electrically coupled to a corresponding one of the plurality of display contact pads with one or more of an anisotropic conductive film or an anisotropic paste.

4. The electronic device of claim 1, further comprising:
a device housing;
a cover glass coupled to the device housing, the cover glass having an exterior side and an interior side opposite the exterior side; and
wherein the display assembly is coupled to the interior side of the cover glass.

5. The electronic device of claim 1, wherein:
the display assembly comprises a first electrical interface; and
the second side of the silicon substrate comprises a second electrical interface coupled to the first electrical interface.

6. The electronic device of claim 1, wherein:
the display assembly comprises one or more of the following: a liquid crystal display (LCD), an organic light emitting diode (OLED) display, an electrophoretic display (EPD), an electrowetting display (EWD), or an electrochromic display (ECD).

7. The electronic device of claim 1, further comprising:
an electromagnetic interference (EMI) shield coupled to the second side of the silicon substrate; and
a first electronic component coupled to the second side of the silicon substrate inside of the EMI shield.

8. The electronic device of claim 1, wherein:
the display assembly comprises a first electrical interface; and
the second side of the silicon substrate comprises a second electrical interface coupled to the first electrical interface.

9. The electronic device of claim 1, wherein:
the silicon substrate comprises a plurality of castellated contacts on an edge of the silicon substrate.

10. The electronic device of claim 1, wherein the second side of the silicon substrate comprises one or more of the following: a camera module interface, a memory interface, or a wireless communications interface.

11. An electronic device, comprising:
a display assembly operable to display content;
a silicon substrate having a first side and a second side, wherein the second side of the silicon substrate comprises at least one component interface; and
a reinforcing member comprising a thermosetting polymer molded to the first side of the silicon substrate; and
an adhesive layer directly adhering the reinforcing member to the display assembly.

12. The electronic device of claim 11, wherein:
the display assembly comprises a third side and a fourth side opposite the third side, wherein the third side of the display assembly is operable to display content and the fourth side of the display assembly comprises a first electrical interface;
the adhesive layer directly adheres the fourth side of the display assembly and the reinforcing member; and
the second side of the silicon substrate comprises a second electrical interface coupled to the first electrical interface.

13. The electronic device of claim 11, further comprising:
a device housing;
a cover glass coupled to the device housing, the cover glass having an exterior side and an interior side opposite the exterior side; and
wherein the display assembly is coupled to the interior side of the cover glass.

14. The electronic device of claim 11, wherein:
the second side of the silicon substrate comprises one or more of the following: a camera module interface, a memory interface, or a wireless communications interface; and
the electronic device further comprises one or more of the following:
 a camera module electrically coupled to the camera module interface;
 a memory module coupled to the memory interface; or
 a wireless communications module coupled to the wireless communications interface.

15. The electronic device of claim 11, wherein: the silicon substrate comprises a plurality of castellated contacts on a first edge of the silicon substrate.

16. The electronic device of claim 15, wherein:
the reinforcing member comprises a printed circuit board (PCB) interposer between the silicon substrate and the display assembly, the PCB interposer comprising a plurality of contact pins, each contact pin being electrically coupled to a corresponding one of the plurality of castellated contacts.

17. The electronic device of claim 16, further comprising:
a second silicon substrate comprising a second plurality of castellated contacts on a second edge of the second silicon substrate, wherein the PCB interposer further comprises a second plurality of contact pins, each contact pin being electrically coupled to a corresponding one of the second plurality of castellated contacts.

18. An electronic device, comprising:
a display assembly being operable to display content, the display assembly having an image display side and an interface side opposite the image display side, wherein the interface side comprises a plurality of display contact pads;
a silicon substrate having a first side and a second side, wherein the first side of the silicon substrate comprises a plurality of substrate contact pads, each substrate contact pad of the plurality of substrate contact pads being electrically coupled to a corresponding one of the plurality of display contact pads, wherein the second side of the silicon substrate comprises at least one component interface comprising one or more of the following: a camera module interface, a memory interface, or a wireless communications interface;
an adhesive layer directly adhering the first side of the silicon substrate to the interface side of the display assembly; and
one or more of the following:
 a camera module electrically coupled to the camera module interface;
 a memory module coupled to the memory interface; or
 a wireless communications module coupled to the wireless communications.

19. The electronic device of claim 18, wherein each substrate contact pad of the plurality of substrate contact pads being electrically coupled to a corresponding one of the plurality of display contact pads with one or more of an anisotropic conductive film or an anisotropic paste.

20. An electronic device, comprising:
a display assembly operable to display content;
a silicon substrate having a first side and a second side, wherein the second side of the silicon substrate comprises at least one component interface and one or more of the following: a camera module interface, a memory interface, or a wireless communications interface;
a reinforcing member coupled to the first side of the silicon substrate;
an adhesive layer directly adhering the reinforcing member to the display assembly; and
one or more of the following: a camera module electrically coupled to the camera module interface, a memory module coupled to the memory interface, or a wireless communications module coupled to the wireless communications interface.

21. The electronic device of claim 20, wherein:
the silicon substrate comprises a plurality of castellated contacts on a first edge of the silicon substrate.

22. The electronic device of claim 21, wherein:
the reinforcing member comprises a printed circuit board (PCB) interposer between the silicon substrate and the display assembly, the PCB interposer comprising a plurality of contact pins, each contact pin being electrically coupled to a corresponding one of the plurality of castellated contacts.

23. The electronic device of claim 22, further comprising:
a second silicon substrate comprising a second plurality of castellated contacts on a second edge of the second silicon substrate, wherein the PCB interposer further comprises a second plurality of contact pins, each contact pin being electrically coupled to a corresponding one of the second plurality of castellated contacts.

* * * * *